(12) United States Patent
Scheller et al.

(10) Patent No.: US 11,099,393 B2
(45) Date of Patent: Aug. 24, 2021

(54) SURFACE EMITTING LIGHT SOURCE WITH LATERAL VARIANT REFRACTIVE INDEX PROFILE

(71) Applicant: Facebook Technologies, LLC, Menlo Park, CA (US)

(72) Inventors: Maik Andre Scheller, Redmond, WA (US); Anurag Tyagi, Kirkland, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/692,648

(22) Filed: Nov. 22, 2019

(65) Prior Publication Data

US 2021/0157142 A1 May 27, 2021

(51) Int. Cl.
| | |
|---|---|
| *G02B 6/26* | (2006.01) |
| *G02B 27/01* | (2006.01) |
| *H01L 23/00* | (2006.01) |
| *H01L 33/06* | (2010.01) |
| *H01L 33/08* | (2010.01) |
| *H01L 33/14* | (2010.01) |
| *H01L 33/24* | (2010.01) |

(Continued)

(52) U.S. Cl.
CPC ....... *G02B 27/0172* (2013.01); *G02B 6/0023* (2013.01); *H01L 24/08* (2013.01);
(Continued)

(58) Field of Classification Search
CPC .............. G02B 27/0172; G02B 6/0023; G02B 2027/0178; H01L 33/24; H01L 33/58;
(Continued)

(56) References Cited

U.S. PATENT DOCUMENTS

| | | | | |
|---|---|---|---|---|
| 5,493,577 A | * | 2/1996 | Choquette | ............. H01L 33/105 |
| | | | | 257/E33.069 |
| 5,881,085 A | * | 3/1999 | Jewell | ...................... G02B 3/00 |
| | | | | 257/79 |

(Continued)

OTHER PUBLICATIONS

Geib, et al., "Fabrication Issues of Oxide-Confined VCSELs", Proceedings, vol. 3003, Vertical-Cavity Surface-Emitting Lasers, Apr. 4, 1997, pp. 69-74.

(Continued)

*Primary Examiner* — Ellen E Kim
(74) *Attorney, Agent, or Firm* — Weaver Austin Villeneuve & Sampson LLP

(57) ABSTRACT

A micro-LED includes a light emitting device that emits a light beam surface—normally and a plurality of semiconductor layers that modify the light beam. Each semiconductor layer includes a first lateral region and a second lateral region, where the first lateral region and the second lateral region are characterized by different respective refractive indices. The first lateral regions of the plurality of semiconductor layers are arranged in two or more different lateral areas of the semiconductor light source. The second lateral region in each semiconductor layer of the plurality of semiconductor layers includes a semiconductor material with a different respective composition. The plurality of semiconductor layers form a planar optical component that is used to, for example, collimate, converge, diverge, or deflect the light beam emitted by the light emitting device.

29 Claims, 21 Drawing Sheets

(51) Int. Cl.
*H01L 33/30* (2010.01)
*H01L 33/58* (2010.01)
*F21V 8/00* (2006.01)
*H01L 25/16* (2006.01)

(52) U.S. Cl.
CPC ............ *H01L 25/167* (2013.01); *H01L 33/06* (2013.01); *H01L 33/08* (2013.01); *H01L 33/14* (2013.01); *H01L 33/24* (2013.01); *H01L 33/30* (2013.01); *H01L 33/58* (2013.01); *G02B 2027/0178* (2013.01); *H01L 2224/08145* (2013.01); *H01L 2924/10336* (2013.01); *H01L 2924/10349* (2013.01); *H01L 2924/12041* (2013.01); *H01L 2924/12042* (2013.01); *H01L 2924/1426* (2013.01)

(58) Field of Classification Search
CPC ....... H01L 33/30; H01L 25/167; H01L 33/08; H01L 33/14; H01L 33/06; H01L 24/08; H01L 2924/12041; H01L 2924/1426; H01L 2924/12042; H01L 2924/10349; H01L 2924/10336; H01L 2224/08145
See application file for complete search history.

(56) References Cited

U.S. PATENT DOCUMENTS

| | | | | |
|---|---|---|---|---|
| 6,317,446 | B1* | 11/2001 | Wipiejewski | H01S 5/18313 372/46.01 |
| 8,031,752 | B1* | 10/2011 | Johnson | H01S 5/18361 372/43.01 |
| 8,189,642 | B1* | 5/2012 | Li | H01S 5/18352 372/50.124 |
| 9,337,621 | B2* | 5/2016 | Kaneko | H01S 5/18344 |
| 2009/0262765 | A1* | 10/2009 | Chang | H01S 5/18333 372/26 |
| 2012/0134382 | A1* | 5/2012 | Mayer | H01S 5/18333 372/46.013 |
| 2016/0352071 | A1* | 12/2016 | Hogan | H01S 5/18388 |
| 2016/0352074 | A1* | 12/2016 | Hogan | H01S 5/18388 |
| 2017/0063040 | A1* | 3/2017 | Su | H01S 5/02469 |
| 2017/0098741 | A1* | 4/2017 | Lee | H01L 33/38 |
| 2018/0174833 | A1* | 6/2018 | Meyer | H01L 21/02447 |
| 2018/0175262 | A1* | 6/2018 | Jansen | H01L 33/54 |
| 2018/0273372 | A1* | 9/2018 | Piechocinski | H04R 19/04 |
| 2019/0020858 | A1* | 1/2019 | Pappas | G02B 27/01 |
| 2019/0089127 | A1* | 3/2019 | Gazula | H01S 5/18311 |
| 2019/0148592 | A1* | 5/2019 | Takeuchi | H01L 33/007 257/103 |
| 2019/0156721 | A1* | 5/2019 | Blank | G11C 19/30 |
| 2019/0212482 | A1* | 7/2019 | Richards | G02B 3/08 |

OTHER PUBLICATIONS

Hawkins, et al., "Reliability of Various Size Oxide Aperture VCSELs", 52nd Electronic Components and Technology Conference, Feb. 2002, pp. 540-550.

Stewart, et al., "Chemical Etching of (AlxGa1-x)0.5In0.5P Using Sulfuric and Hydrochloric Acids", Journal of the Electrochemical Society, vol. 139, No. 4, Apr. 1992, pp. 1217-1219.

* cited by examiner

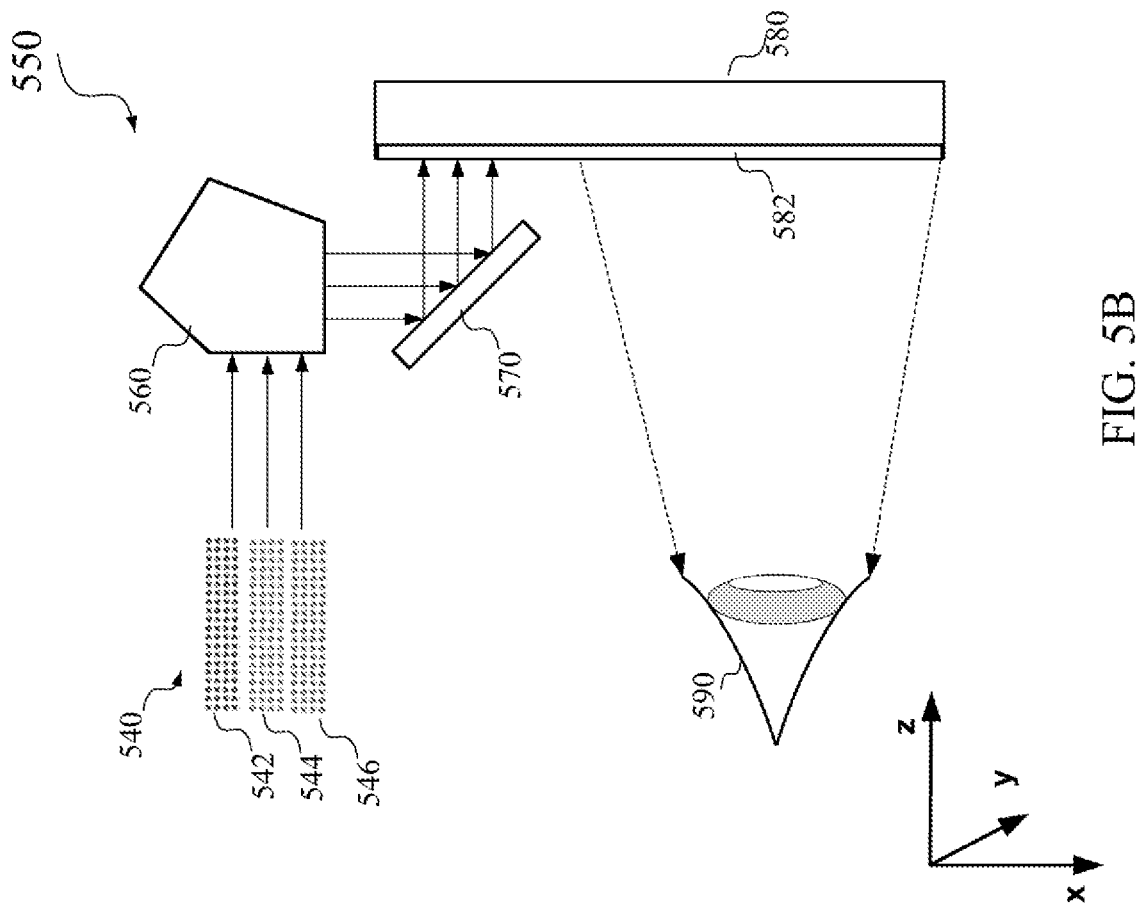
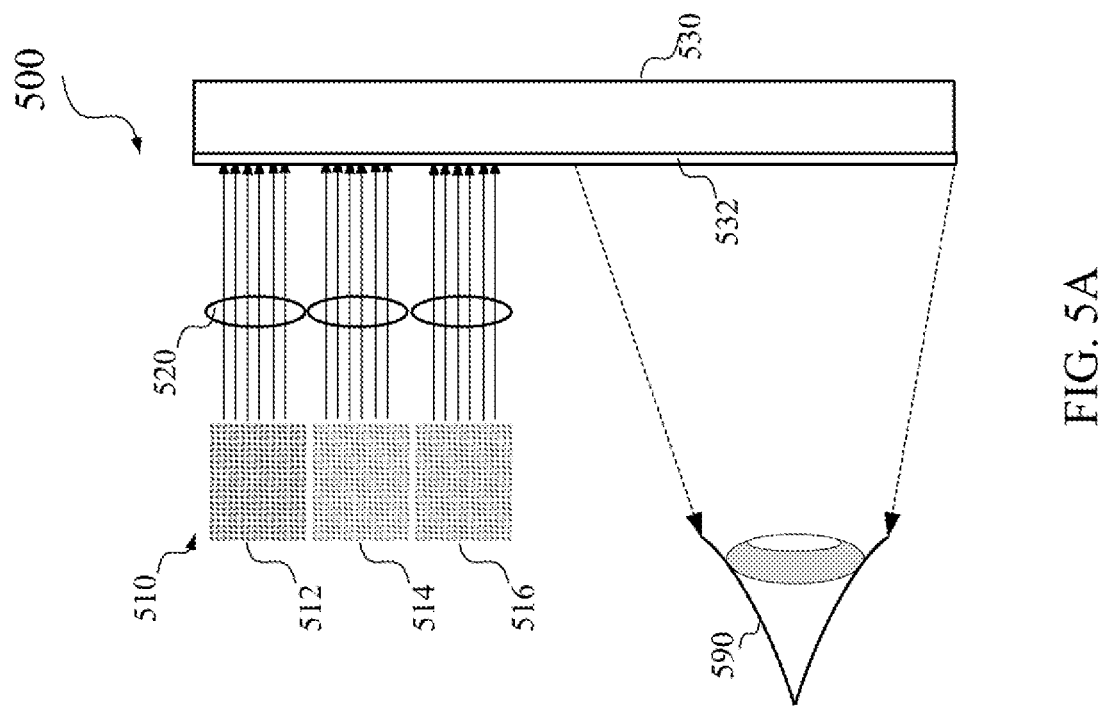

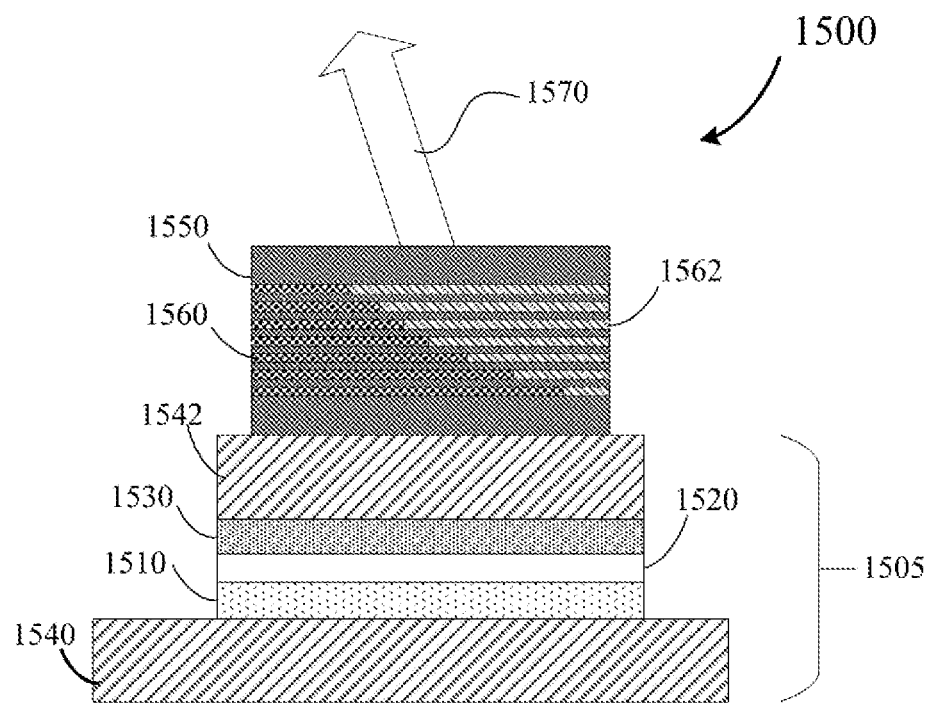
FIG. 15
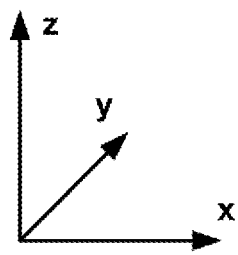

1700

Deposit a plurality of semiconductor layers susceptible to different oxidation rates (or etch rates) on a light emitting device
1702

Form mesa structure for the light emitting device
1704

Form trenches in the plurality of semiconductor layers
1706

Perform lateral oxidation (or lateral etching) of the plurality of semiconductor layers
1708

FIG. 17

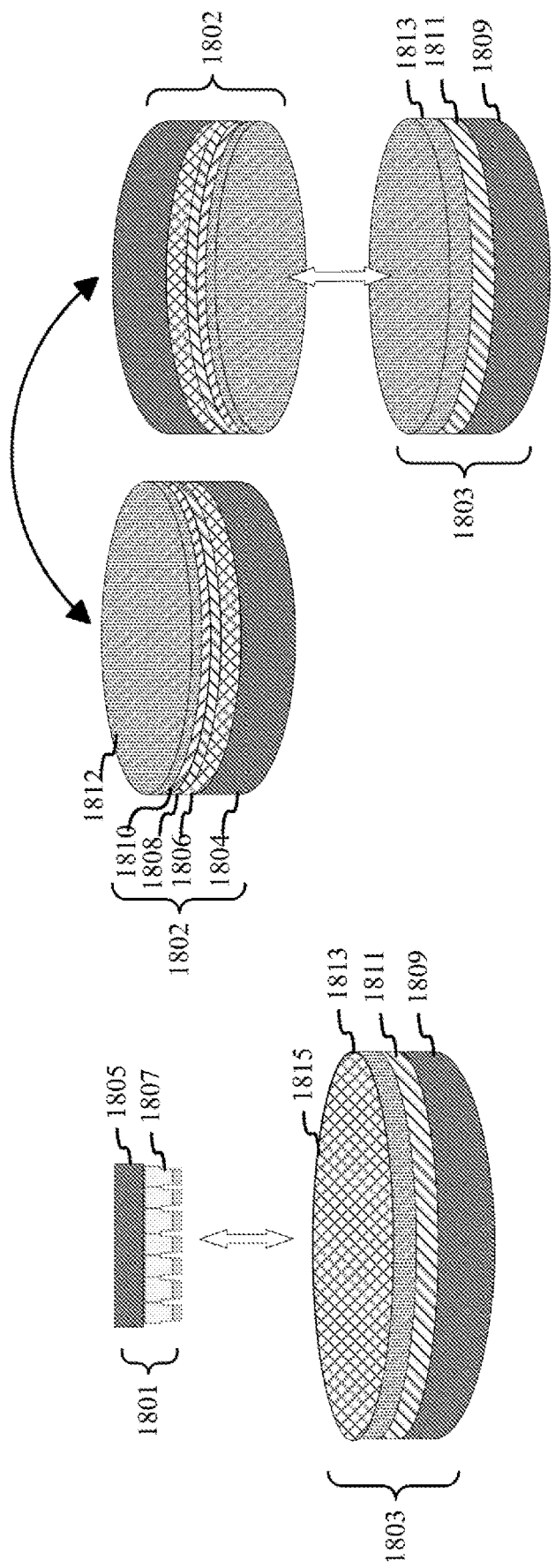

SURFACE EMITTING LIGHT SOURCE WITH LATERAL VARIANT REFRACTIVE INDEX PROFILE

BACKGROUND

Light emitting devices, such as light emitting diodes (LEDs), micro-LEDs, resonant cavity LEDs (RCLEDs), vertical cavity surface emitting lasers (VCSELs), vertical external cavity surface emitting lasers (VECSELs), and the like, convert electrical energy into optical energy, and offer many benefits over other light sources, such as reduced size, improved durability, and increased efficiency. Light emitting devices can be used as light sources in many display systems, such as televisions, computer monitors, laptop computers, tablets, smartphones, projection systems, and wearable electronic devices. For example, micro-LEDs that emit light of different colors (e.g., red, green, and blue) can be used to form the sub-pixels of a display system, such as a near-eye display system, and micro-LEDs that emit infrared light can be used for eye illumination in eye tracking. Micro-LEDs and other light emitting devices can also be deployed in various sensor systems, such as systems for depth sensing, three-dimensional sensing, object tracking (e.g., hand tracking or face tracking), and the like.

SUMMARY

This disclosure relates generally to semiconductor light emitting devices. More specifically, and without limitation, this disclosure relates to semiconductor light emitting devices with planar optical components (e.g., micro-lenses or wedges) for modifying the wavefront of the light beams emitted by the semiconductor light emitting devices, such as collimating, focusing, defocusing, or deflecting the emitted light beams. The planar optical components can be more precisely and more reliably manufactured using semiconductor processing techniques, such as epitaxial growth and lateral oxidation or wet etching. Various inventive embodiments are described herein, including devices, systems, methods, materials, and the like.

According to some embodiments, a semiconductor light source may include a light emitting device configured to emit a light beam surface-normally and a plurality of semiconductor layers configured to modify the light beam emitted by the light emitting device. Each semiconductor layer of the plurality of semiconductor layers may include a first lateral region and a second lateral region, where the first lateral region and the second lateral region may have different respective refractive indices. The first lateral regions of the plurality of semiconductor layers may be in two or more different lateral areas of the semiconductor light source. In some embodiments, the second lateral region in each semiconductor layer of the plurality of semiconductor layers includes a semiconductor material with a different respective composition.

In some embodiments of the semiconductor light source, the semiconductor material in the second lateral region in each semiconductor layer of the plurality of semiconductor layers may be characterized by a different respective lateral oxidation or etch rate. In some embodiments, the second lateral region in each semiconductor layer of the plurality of semiconductor layers may include $Al_xGa_{1-x}As$ and may be characterized by a different respective x value that is greater than 0.7. In some embodiments, the second lateral region in each semiconductor layer of the plurality of semiconductor layers may include $(Al_xGa_{1-x})_{0.5}In_{0.5}P$ and may be characterized by a different respective x value. In some embodiments, the first lateral region may include an oxide region and the second lateral region may include an unoxidized semiconductor region. In some embodiments, the first lateral region may include an air gap and the second lateral region may include a semiconductor material. In some embodiments, each semiconductor layer of the plurality of semiconductor layers may include a planar layer.

In some embodiments, the plurality of semiconductor layers may be in adjacent epitaxial layers. In some embodiments, the plurality of semiconductor layers may be interleaved with a plurality of interlayers. In some embodiments, the plurality of semiconductor layers and the plurality of interlayers may be configured to form an antireflection structure for the light beam.

In some embodiments, the first lateral regions of the plurality of semiconductor layers may be arranged in two or more different lateral areas such that the plurality of semiconductor layers may collimate, converge, diverge, or deflect the light beam emitted by the light emitting device. In some embodiments, the first lateral regions of the plurality of semiconductor layers may be arranged in two or more different lateral areas such that an optical path length (OPL) profile of the plurality of semiconductor layers may be characterized by an OPL profile of a lens laterally aligned with the light emitting device, a lens laterally offset from the light emitting device, or a prism.

In some embodiments, the light emitting device may include a current conduction region that may include an electron injection layer, a hole injection layer, and a light emission layer between the electron injection layer and the hole injection layer. The plurality of semiconductor layers may be outside of the current conduction region. In some embodiments, the light emission layer may include a quantum dot structure, a quantum well structure, or a multiple-quantum-well (MQW) structure. In some embodiments, the light emitting device may include an optical cavity and the plurality of semiconductor layers may be in the optical cavity. In some embodiments, the light emitting device may include a light emitting diode (LED), a micro-LED, a resonant cavity LED (RCLED), a vertical cavity surface emitting laser (VCSEL), or a vertical external cavity surface emitting laser (VECSEL).

According to certain embodiments, a display projector may include an array of light sources. Each light source in the array of light sources may include a light emitting device configured to emit a light beam surface-normally, and a planar optical component including a plurality of semiconductor layers and configured to modify the light beam emitted by the light emitting device. Each semiconductor layer of the plurality of semiconductor layers may include a first lateral region and a second lateral region, where the first lateral region and the second lateral region may be characterized by different respective refractive indices and the first lateral regions of the plurality of semiconductor layers may be in two or more different lateral areas of the planar optical component. In some embodiments, the second lateral region in each semiconductor layer of the plurality of semiconductor layers may include a semiconductor material characterized by a different respective composition. In some embodiments, the planar optical component in each light source may be configured to direct the light beam emitted by the light emitting device to a different respective direction. In some embodiments, the planar optical component in each light source of the array of light sources may include a lens characterized by a different respective lateral displacement from the light emitting device in the light source. In some embodiments, the array of light sources may include a two-dimensional array of light sources. In some embodiments, each light source in the array of light sources may further include a driver circuit bonded to the light emitting device.

According to certain embodiments, a semiconductor wafer may include an n-type semiconductor layer, a p-type semiconductor layer, a light emitting layer between the n-type semiconductor layer and the p-type semiconductor layer, and a plurality of epitaxial layers. Each epitaxial layer of the plurality of epitaxial layers may include a different respective composition of a semiconductor material and may be characterized by a different respective lateral oxidation or etch rate. In some embodiments, the plurality of epitaxial layers may be in adjacent layers. In some embodiments, the plurality of epitaxial layers may be interleaved with a plurality of interlayers that are characterized by a lower lateral oxidation or etch rate than the plurality of epitaxial layers. In some embodiments, each of the plurality of epitaxial layers may include $Al_xGa_{1-x}As$ or $(Al_xGa_{1-x})_{0.5}In_{0.5}P$, and may be characterized by a different respective x value.

According to certain embodiments, a display system may include an array of light sources configured to generate display light for an image, a waveguide display, and an optical coupler configured to couple the display light into the waveguide display. Each light source in the array of light sources may include a light emitting device configured to emit a light beam surface-normally, and a planar optical component configured to direct the light beam to a different respective direction. The planar optical component may include a plurality of planar semiconductor layers. In some embodiments, each planar semiconductor layer of the plurality of planar semiconductor layers may include a first lateral region and a second lateral region, where the first lateral region and the second lateral region may have different respective refractive indices, and the first lateral regions of the plurality of planar semiconductor layers may be in two or more different lateral areas of the planar optical component.

According to certain embodiments, a method may include depositing a plurality of semiconductor layers on a light emitting device, where the plurality of semiconductor layers may have different compositions and different lateral oxidation rates or lateral etch rates. The method may also include forming trenches in the plurality of semiconductor layers, and performing, through the trenches, lateral oxidation or lateral etching of the plurality of semiconductor layers.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 5A illustrates an example of a near-eye display device including a waveguide display according to certain embodiments. FIG. 5B illustrates an example of a near-eye display device including a waveguide display according to certain embodiments.

FIG. 15 illustrates an example of a light source including a vertical cavity surface emitting laser (VCSEL) and a planar optical component according to certain embodiments.

FIG. 17 is a flowchart illustrating an example of a process of fabricating a planar optical component on a light emitting device according to certain embodiments.

FIG. 18A illustrates an example of a method of die-to-wafer bonding for arrays of LEDs according to certain embodiments. FIG. 18B illustrates an example of a method of wafer-to-wafer bonding for arrays of LEDs according to certain embodiments.

Figure 1:
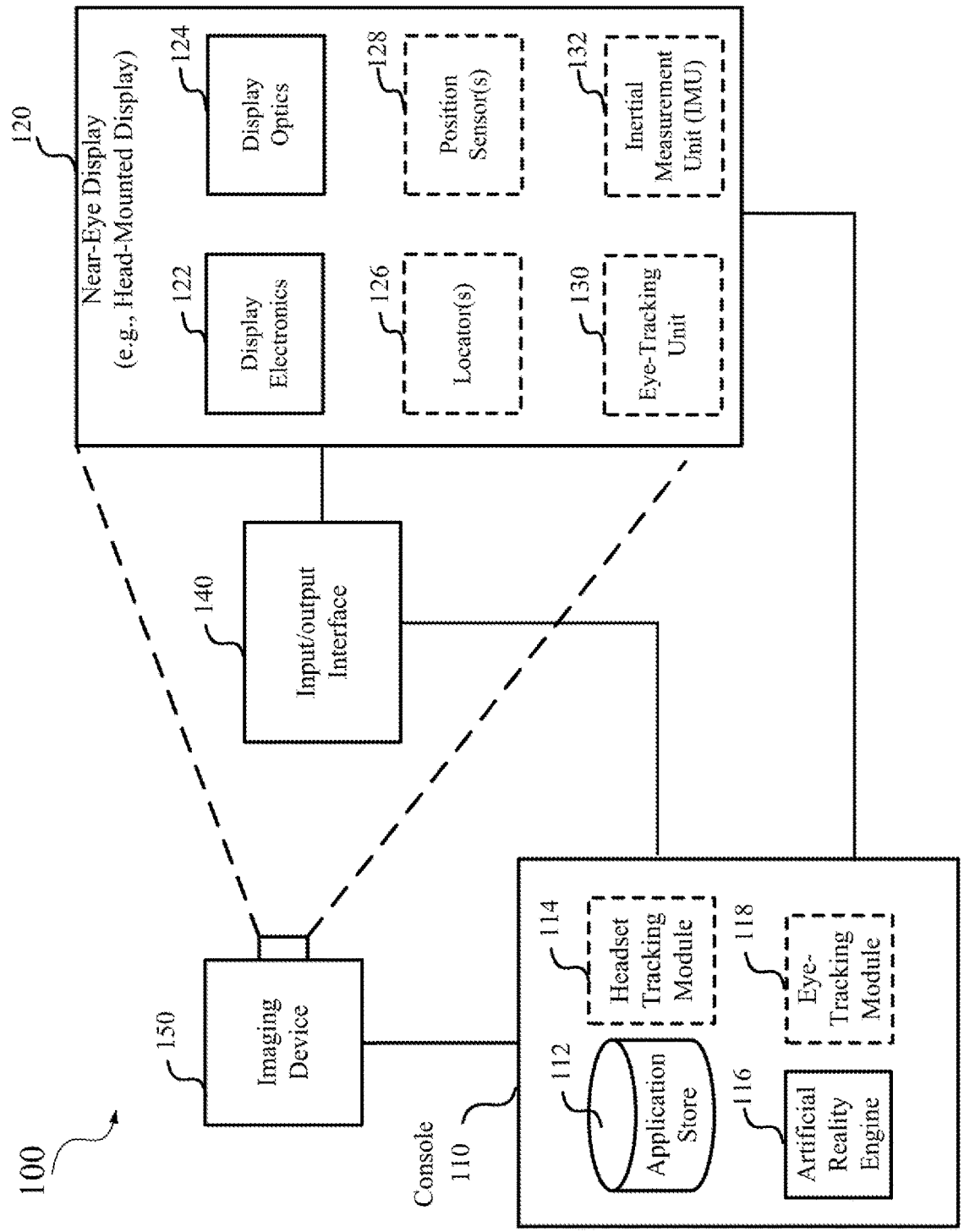
FIG. 1 is a simplified block diagram of an example of an artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to semiconductor light emitting devices, such as light emitting diodes (LEDs), vertical cavity surface emitting lasers (VCSELs), and vertical external cavity surface emitting lasers (VECSELs). More specifically, and without limitation, techniques disclosed herein relate to semiconductor light emitting devices with planar optical components (e.g., micro-lenses or wedges) for modifying the wavefront of light beams emitted by the semiconductor light emitting devices, such as collimating, focusing, defocusing, or deflecting the emitted light beams. The planar optical components may be formed in a plurality of semiconductor layers epitaxially grown on the light emitting devices. The plurality of semiconductor layers may each have a respective composition and may be laterally oxidized or etched at different rates to form regions with different refractive indices and thus desired optical path length (OPL) or optical thickness profiles of various optical components. The thickness and the composition of each epitaxial layer can be precisely controlled to more precisely and more reliably fabricate the planar optical components using semiconductor processing techniques, such as photolithography, lateral oxidation, and/or wet etching. Various inventive embodiments are described herein, including devices, systems, methods, materials, and the like.

Wafer-level processed light sources in surface (e.g., top or bottom surface) emitting geometry may allow for efficient conversion of electrical energy into photons in small regions, and thus may be suitable for use in compact display systems, such as near eye displays. Light emitters fabricated using layer-by-layer, wafer level processing may have planar geometry or certain mesa structures. The geometry or the mesa structures of the light emitters may determine, to a large extent, beam divergence properties and the direction of the resultant chief ray in relation to the wafer surface. In generally, the chief ray of the light emission from the active region is in a direction orthogonally to the wafer surface, which may be referred to as surface-normal emitting or surface-emitting.

In some display systems, light emitted from a light source (e.g., a micro-LED array) may be collimated and coupled into a display (e.g., a waveguide display) for delivering images to an output pupil (or eyebox). The overall efficiency $\eta_{tot}$ of a display system may be determined by $\eta_{tot} = \eta_{EQE} \times \eta_{in} \times \eta_{out}$, where $\eta_{EQE}$ is the external quantum efficiency (EQE) of each light source (e.g., a micro-LED) and may be proportional to the carrier (e.g., electron) injection efficiency, the internal quantum efficiency, and the light extraction efficiency (LEE). $\eta_{in}$ is the in-coupling efficiency of display light from the micro-LEDs into the waveguide, and $\eta_{out}$ is the out-coupling efficiency of the display light from the waveguide towards the user's eye. For example, only a fraction of the extracted light that is within a certain solid angle may be coupled into the waveguide and eventually reach the user's eyes due to the limited field of view and/or exit pupil (or eyebox) of the display system. Thus, it may be desirable to modify the wavefront of the light beams emitted from the micro-LEDs such that the light beams may be more efficiently extracted from the micro-LEDs and coupled into the waveguide and user's eyes. In some embodiments, the light emitting devices, such as infrared micro-LEDs, may be used to illuminate user's eyes from different angles for precise and reliable eye tracking, and thus may include some optical components to deflect the emitted light beams to desired directions. In some embodiments, the light emitting devices may be used in various sensor systems, such as systems for depth sensing, three-dimensional sensing, object tracking (e.g., hand tracking or face tracking), and the like, where the light beams emitted by the light emitting devices may be scanned or otherwise directed to desired directions or regions.

The beam profile or wavefront of an emitted light beam, such as the beam divergence and beam direction, may be modified using three-dimensional structures formed on the surface of the light source. The three-dimensional structures, such as micro-lenses and prisms, may be fabricated by, for example, photolithography using gray scale masks and photoresists with linear response or thermal reflowing of patterned etch mask, and etching (e.g., dry etching) the etch mask and the underlying material layer to transfer the thickness profile from the etch mask to the underlying material layer. Thus, multiple materials with certain desired properties and additional precisely-controlled processes may be used to achieve reproducible results within industry tolerances. The added complexity may impact the yield, cost, and/or performance of the manufactured devices. It is therefore desirable to implement an integrated solution for fabricating light beam modification structures using wafer level processing.

According to certain embodiments, planar optical components for light beam modification may be manufactured using wafer level processing techniques that can be integrated with the processing for fabricating semiconductor light emitting devices and that are precise, reliable, and cost-effective, such as epitaxial growth and lateral oxidation or wet etching techniques. In one example, a plurality of semiconductor layers may be epitaxially grown on a light-emission surface of light emitters, such as on an n-type or p-type semiconductor layer or a multilayer distributed Bragg reflecting (DBR) mirror of a light emitter. The compositions of the semiconductor layers may vary across the plurality of semiconductor layers, and thus may have different lateral oxidation rates or lateral etch rates. In some embodiments, trenches may be formed in certain regions of the plurality of semiconductor layers according to a desired pattern, and the semiconductor layers may then be laterally oxidized or wet etched through the exposed edges in the trenches. The oxidation (or etch) rate can be controlled through the selection of appropriate layer composition, and the oxidation (or etch) region can be controlled by the oxidation (or etch) rate and the duration of exposure to oxidizing agents (or etchants). These processes may be compatible with the wafer-level processing used for fabricating planar light sources. The different rates of oxidation or etching for the different layers may result in an OPL or optical thickness profile of a desired optical component within the plurality of semiconductor layers due to the different (e.g., lower) refractive index of the oxide compared with the unoxidized semiconductor materials. For example, in some embodiments, the OPL profile may correspond to a micro-lens with a certain focal length, a prism, or the combination of two or more optical components, such as a micro-lens and a prism.

Therefore, techniques disclosed herein be used to manufacture optical components for modifying light beams emitted from a planar light source array, without using three-dimensional surface topographical patterning, and are compatible with the processes used to manufacture the planar light source array. Furthermore, planar optical components with various OPL profiles can be fabricated, rather than only certain profiles (e.g., the OPL profile of a plano-covex micro-lens) that can be achieved using other techniques, such as the thermal reflowing technique. For example, it may be difficult to etch a surface structure that has larger dimensions on top, such as an upside-down cone or a bi-convex lens, by depth profile transferring using vertical etching techniques. As described in detail below, techniques disclosed herein can be used to fabricate optical components having the OPL profiles of these structures. In addition, different optical components can be formed for different light sources in an array, such as micro-lenses with different lateral displacement from the corresponding light sources. Moreover, different optical components can be fabricated using a pre-fabricated wafer that includes active layers and a plurality of semiconductor layers susceptible to different oxidation or etch rates by selecting the appropriate location of trenches used for lateral oxidation or lateral etching.

The light emitting devices described herein may be used in conjunction with various technologies, such as an artificial reality system. An artificial reality system, such as a head-mounted display (HMD) or heads-up display (HUD) system, generally includes a display configured to present artificial images that depict objects in a virtual environment. The display may present virtual objects or combine images of real objects with virtual objects, as in virtual reality (VR), augmented reality (AR), or mixed reality (MR) applications. For example, in an AR system, a user may view both displayed images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through). In some AR systems, the artificial images may be presented to users using an LED-based display subsystem.

As used herein, the term "light emitting diode (LED)" refers to a light source that includes at least an n-type semiconductor layer, a p-type semiconductor layer, and a light emitting region (i.e., active region) between the n-type semiconductor layer and the p-type semiconductor layer. The light emitting region may include one or more semiconductor layers that form one or more heterostructures, such as quantum wells. In some embodiments, the light emitting region may include multiple semiconductor layers that form one or more multiple-quantum-wells (MQWs), each including multiple (e.g., about 2 to 6) quantum wells.

As used herein, the term "micro-LED" or "µLED" refers to an LED that has a chip where a linear dimension of the chip is less than about 200 µm, such as less than 100 µm, less than 50 µm, less than 20 µm, less than 10 µm, or smaller. For example, the linear dimension of a micro-LED may be as small as 6 µm, 5 µm, 4 µm, 2 µm, or smaller. Some micro-LEDs may have a linear dimension (e.g., length or diameter) comparable to the minority carrier diffusion length. However, the disclosure herein is not limited to micro-LEDs, and may also be applied to mini-LEDs and large LEDs.

As used herein, the term "bonding" may refer to various methods for physically and/or electrically connecting two or more devices and/or wafers, such as adhesive bonding, metal-to-metal bonding, metal oxide bonding, wafer-to-wafer bonding, die-to-wafer bonding, hybrid bonding, soldering, under-bump metallization, and the like. For example, adhesive bonding may use a curable adhesive (e.g., an epoxy) to physically bond two or more devices and/or wafers through adhesion. Metal-to-metal bonding may include, for example, wire bonding or flip chip bonding using soldering interfaces (e.g., pads or balls), conductive adhesive, or welded joints between metals. Metal oxide bonding may form a metal and oxide pattern on each surface, bond the oxide sections together, and then bond the metal sections together to create a conductive path. Wafer-to-wafer bonding may bond two wafers (e.g., silicon wafers or other semiconductor wafers) without any intermediate layers and is based on chemical bonds between the surfaces of the two wafers. Wafer-to-wafer bonding may include wafer cleaning and other preprocessing, aligning and pre-bonding at room temperature, and annealing at elevated temperatures, such as about 250° C. or higher. Die-to-wafer bonding may use bumps on one wafer to align features of a pre-formed chip with drivers of a wafer. Hybrid bonding may include, for example, wafer cleaning, high-precision alignment of contacts of one wafer with contacts of another wafer, dielectric bonding of dielectric materials within the wafers at room temperature, and metal bonding of the contacts by annealing at, for example, 250-300° C. or higher. As used herein, the term "bump" may refer generically to a metal interconnect used or formed during bonding.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140, each of which may be coupled to an optional console 110. While FIG. 1 shows an example of artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audio, or any combination thereof. In some embodiments, audio may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form-factor, including a pair of glasses. Some embodiments of near-eye display 120 are further described below with respect to FIGS. 2 and 3. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of eye-tracking unit 130, locators 126, position sensors 128, and IMU 132, or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (μLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or any combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, comatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be an LED, a corner cube reflector, a reflective marker, a type of light source that contrasts with an environment in which near-eye display 120 operates, or any combination thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may include one or more cameras, one or more video cameras, any other device capable of capturing images including one or more of locators 126, or any combination thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or any combination thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or any combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140. In some embodiments, external imaging device 150 may be used to track input/output interface 140, such as tracking the location or position of a controller (which may include, for example, an IR light source) or a hand of the user to determine the motion of the user. In some embodiments, near-eye display 120 may include one or more imaging devices to track input/output interface 140, such as tracking the location or position of a controller or a hand of the user to determine the motion of the user.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and an eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or any combination thereof, to predict a future location of near-eye display 120. Headset tracking module 114 may provide the estimated or predicted future position of near-eye display 120 to artificial reality engine 116.

Artificial reality engine 116 may execute applications within artificial reality system environment 100 and receive position information of near-eye display 120, acceleration information of near-eye display 120, velocity information of near-eye display 120, predicted future positions of near-eye display 120, or any combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

Figure 2:
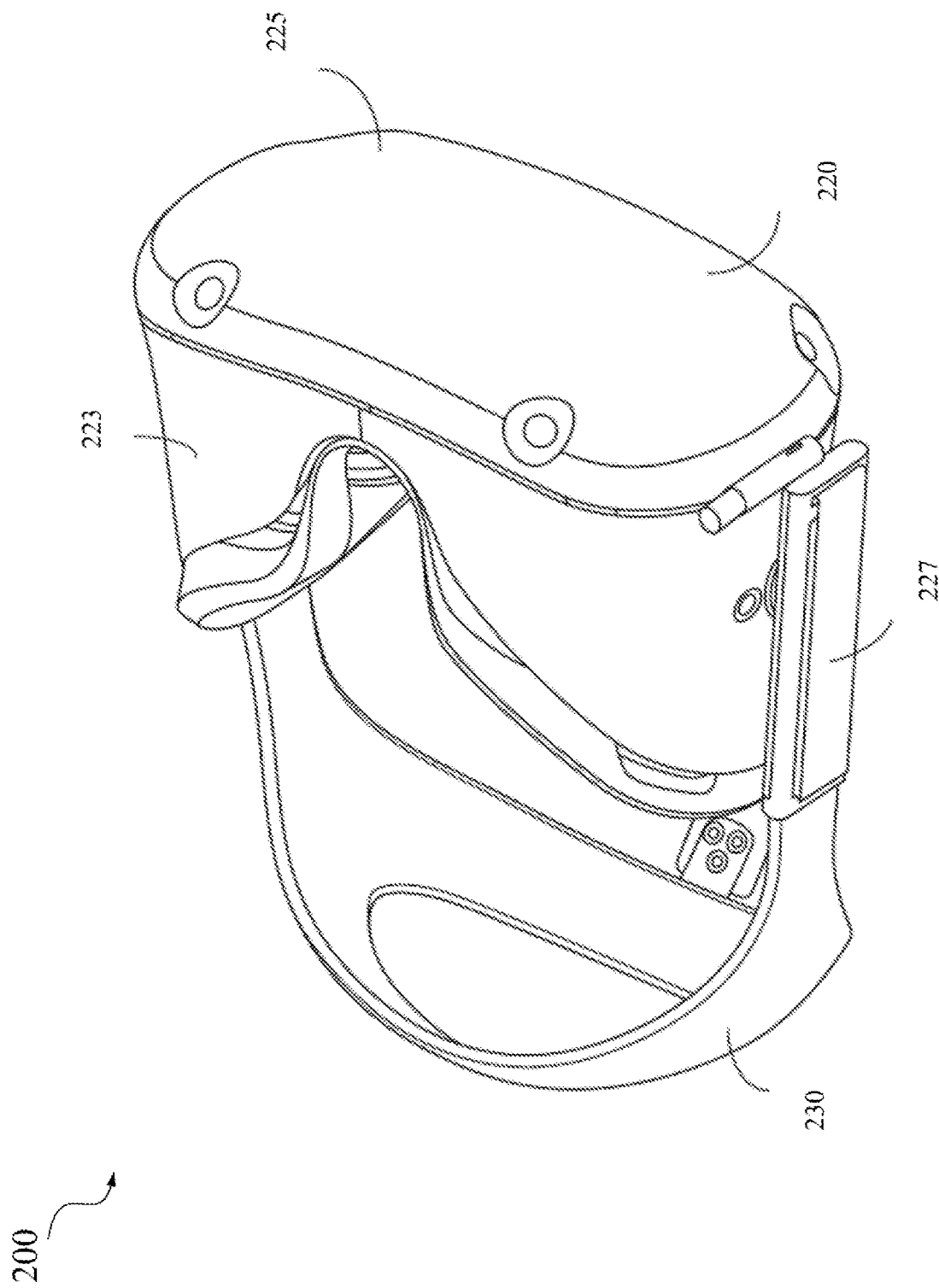
FIG. 2 is a perspective view of an example of a near-eye display in the form of a head-mounted display (HMD) device for implementing some of the examples disclosed herein.

FIG. 2 is a perspective view of an example of a near-eye display in the form of an HMD device 200 for implementing some of the examples disclosed herein. HMD device 200 may be a part of, e.g., a VR system, an AR system, an MR system, or any combination thereof. HMD device 200 may include a body 220 and a head strap 230. FIG. 2 shows a bottom side 223, a front side 225, and a left side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temple tips as shown in, for example, FIG. 3 below, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audio, or any combination thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a μLED display, an AMOLED, a TOLED, some other display, or any combination thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or any combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
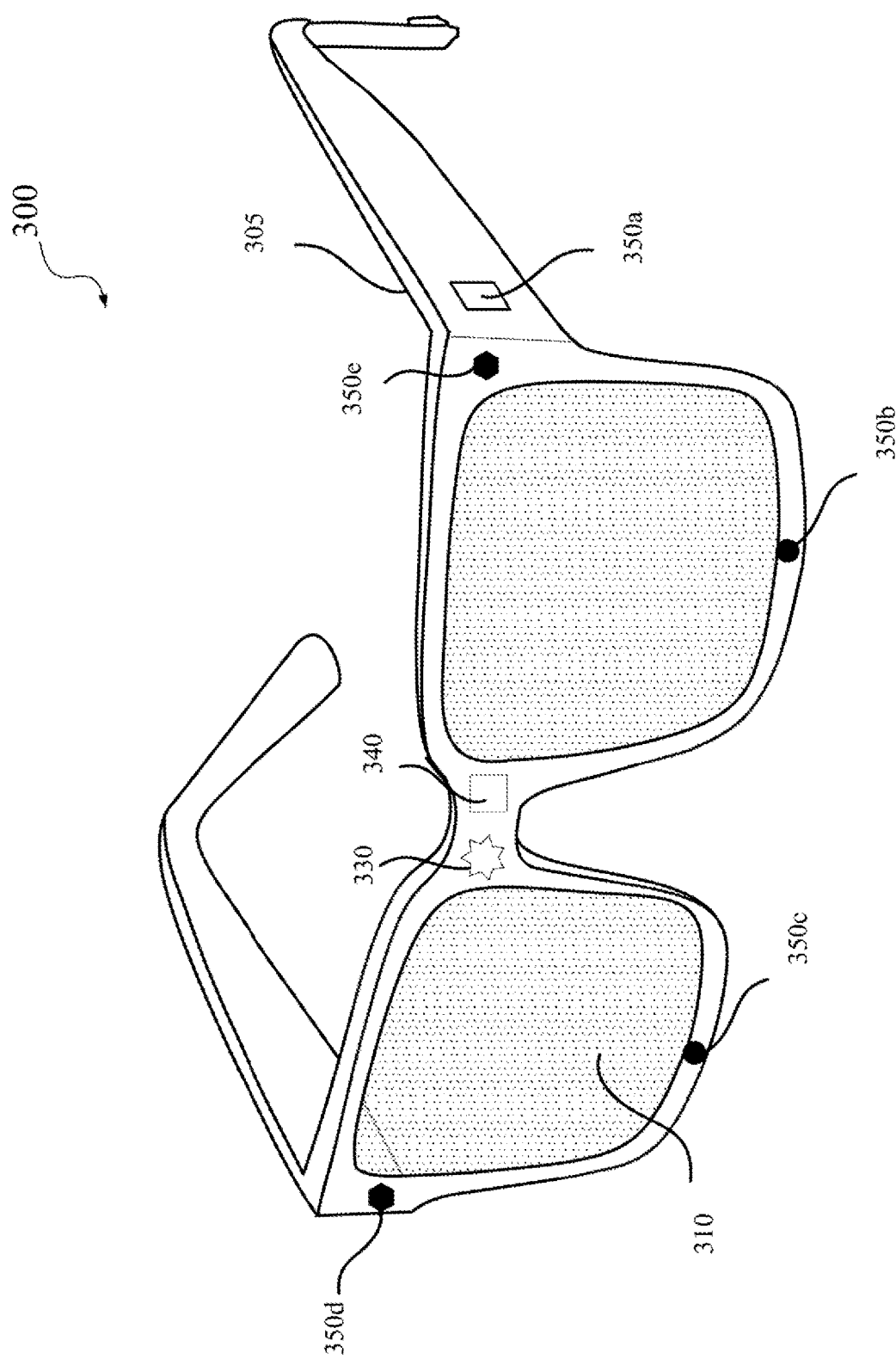
FIG. 3 is a perspective view of an example of a near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light patterns onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
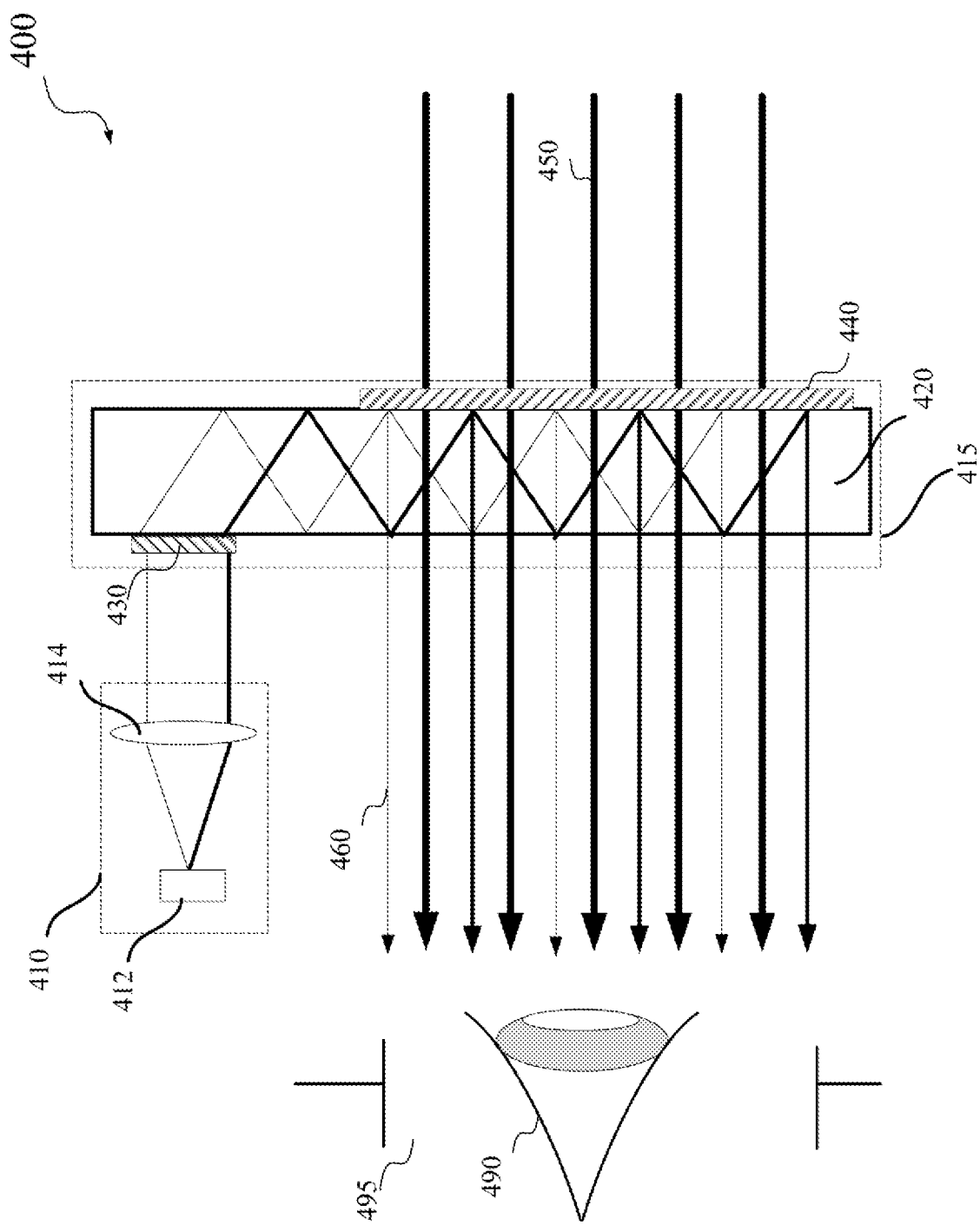
FIG. 4 illustrates an example of an optical see-through augmented reality system including a waveguide display according to certain embodiments.

FIG. 4 illustrates an example of an optical see-through augmented reality system 400 including a waveguide display according to certain embodiments. Augmented reality system 400 may include a projector 410 and a combiner 415. Projector 410 may include a light source or image source 412 and projector optics 414. In some embodiments, light source or image source 412 may include one or more micro-LED devices described above. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, an LED, and/or a micro-LED described above. In some embodiments, image source 412 may include a plurality of light sources (e.g., an array of micro-LEDs described above), each emitting a monochromatic image light corresponding to a primary color (e.g., red, green, or blue). In some embodiments, image source 412 may include three two-dimensional arrays of micro-LEDs, where each two-dimensional array of micro-LEDs may include micro-LEDs configured to emit light of a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. For example, in some embodiments, image source 412 may include one or more one-dimensional arrays or elongated two-dimensional arrays of micro-LEDs, and projector optics 414 may include one or more one-dimensional scanners (e.g., micro-mirrors or prisms) configured to scan the one-dimensional arrays or elongated two-dimensional arrays of micro-LEDs to generate image frames. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. Input coupler 430 may include a volume holographic grating, a diffractive optical element (DOE) (e.g., a surface-relief grating), a slanted surface of substrate 420, or a refractive coupler (e.g., a wedge or a prism). For example, input coupler 430 may include a reflective volume Bragg grating or a transmissive volume Bragg grating. Input coupler 430 may have a coupling efficiency of greater than 30%, 50%, 75%, 90%, or higher for visible light. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 420 may be transparent to visible light.

Substrate 420 may include or may be coupled to a plurality of output couplers 440, each configured to extract at least a portion of the light guided by and propagating within substrate 420 from substrate 420, and direct extracted light 460 to an eyebox 495 where an eye 490 of the user of augmented reality system 400 may be located when augmented reality system 400 is in use. The plurality of output couplers 440 may replicate the exit pupil to increase the size of eyebox 495 such that the displayed image is visible in a larger area. As input coupler 430, output couplers 440 may include grating couplers (e.g., volume holographic gratings or surface-relief gratings), other diffraction optical elements (DOEs), prisms, etc. For example, output couplers 440 may include reflective volume Bragg gratings or transmissive volume Bragg gratings. Output couplers 440 may have different coupling (e.g., diffraction) efficiencies at different locations. Substrate 420 may also allow light 450 from the environment in front of combiner 415 to pass through with little or no loss. Output couplers 440 may also allow light 450 to pass through with little loss. For example, in some implementations, output couplers 440 may have a very low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 in certain desired directions (i.e., diffraction angles) with little loss. As a result, the user may be able to view combined images of the environment in front of combiner 415 and images of virtual objects projected by projector 410.

FIG. 5A illustrates an example of a near-eye display (NED) device 500 including a waveguide display 530 according to certain embodiments. NED device 500 may be an example of near-eye display 120, augmented reality system 400, or another type of display device. NED device 500 may include a light source 510, projection optics 520, and waveguide display 530. Light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of light emitters in light source 510 may be small. For example, each light emitter may have a diameter less than 2 µm (e.g., about 1.2 µm) and the pitch may be less than 2 µm (e.g., about 1.5 µm). As such, the number of light emitters in each red light emitters 512, green light emitters 514, and blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by light source 510. A scanning element may not be used in NED device 500.

Before reaching waveguide display 530, the light emitted by light source 510 may be conditioned by projection optics 520, which may include a lens array. Projection optics 520 may collimate or focus the light emitted by light source 510 to waveguide display 530, which may include a coupler 532 for coupling the light emitted by light source 510 into waveguide display 530. The light coupled into waveguide display 530 may propagate within waveguide display 530 through, for example, total internal reflection as described above with respect to FIG. 4. Coupler 532 may also couple portions of the light propagating within waveguide display 530 out of waveguide display 530 and towards user's eye 590.

FIG. 5B illustrates an example of a near-eye display (NED) device 550 including a waveguide display 580 according to certain embodiments. In some embodiments, NED device 550 may use a scanning mirror 570 to project light from a light source 540 to an image field where a user's eye 590 may be located. NED device 550 may be an example of near-eye display 120, augmented reality system 400, or another type of display device. Light source 540 may include one or more rows or one or more columns of light emitters of different colors, such as multiple rows of red light emitters 542, multiple rows of green light emitters 544, and multiple rows of blue light emitters 546. For example, red light emitters 542, green light emitters 544, and blue light emitters 546 may each include N rows, each row including, for example, 2560 light emitters (pixels). The red light emitters 542 are organized into an array; the green light emitters 544 are organized into an array; and the blue light emitters 546 are organized into an array. In some embodiments, light source 540 may include a single line of light emitters for each color. In some embodiments, light source 540 may include multiple columns of light emitters for each of red, green, and blue colors, where each column may include, for example, 1080 light emitters. In some embodiments, the dimensions and/or pitches of the light emitters in light source 540 may be relatively large (e.g., about 3-5 µm) and thus light source 540 may not include sufficient light emitters for simultaneously generating a full display image. For example, the number of light emitters for a single color may be fewer than the number of pixels (e.g., 2560×1080 pixels) in a display image. The light emitted by light source 540 may be a set of collimated or diverging beams of light.

Before reaching scanning mirror 570, the light emitted by light source 540 may be conditioned by various optical devices, such as collimating lenses or a freeform optical element 560. Freeform optical element 560 may include, for example, a multi-facet prism or another light folding element that may direct the light emitted by light source 540 towards scanning mirror 570, such as changing the propagation direction of the light emitted by light source 540 by, for example, about 90° or larger. In some embodiments, freeform optical element 560 may be rotatable to scan the light. Scanning mirror 570 and/or freeform optical element 560 may reflect and project the light emitted by light source 540 to waveguide display 580, which may include a coupler 582 for coupling the light emitted by light source 540 into waveguide display 580. The light coupled into waveguide display 580 may propagate within waveguide display 580 through, for example, total internal reflection as described above with respect to FIG. 4. Coupler 582 may also couple portions of the light propagating within waveguide display 580 out of waveguide display 580 and towards user's eye 590.

Scanning mirror 570 may include a microelectromechanical system (MEMS) mirror or any other suitable mirrors. Scanning mirror 570 may rotate to scan in one or two dimensions. As scanning mirror 570 rotates, the light emitted by light source 540 may be directed to a different area of waveguide display 580 such that a full display image may be projected onto waveguide display 580 and directed to user's eye 590 by waveguide display 580 in each scanning cycle. For example, in embodiments where light source 540 includes light emitters for all pixels in one or more rows or columns, scanning mirror 570 may be rotated in the column or row direction (e.g., x or y direction) to scan an image. In embodiments where light source 540 includes light emitters for some but not all pixels in one or more rows or columns, scanning mirror 570 may be rotated in both the row and column directions (e.g., both x and y directions) to project a display image (e.g., using a raster-type scanning pattern).

NED device 550 may operate in predefined display periods. A display period (e.g., display cycle) may refer to a duration of time in which a full image is scanned or projected. For example, a display period may be a reciprocal of the desired frame rate. In NED device 550 that includes scanning mirror 570, the display period may also be referred to as a scanning period or scanning cycle. The light generation by light source 540 may be synchronized with the rotation of scanning mirror 570. For example, each scanning cycle may include multiple scanning steps, where light source 540 may generate a different light pattern in each respective scanning step.

In each scanning cycle, as scanning mirror 570 rotates, a display image may be projected onto waveguide display 580 and user's eye 590. The actual color value and light intensity (e.g., brightness) of a given pixel location of the display image may be an average of the light beams of the three colors (e.g., red, green, and blue) illuminating the pixel location during the scanning period. After completing a scanning period, scanning mirror 570 may revert back to the initial position to project light for the first few rows of the next display image or may rotate in a reverse direction or scan pattern to project light for the next display image, where a new set of driving signals may be fed to light source 540. The same process may be repeated as scanning mirror 570 rotates in each scanning cycle. As such, different images may be projected to user's eye 590 in different scanning cycles.

Figure 6:
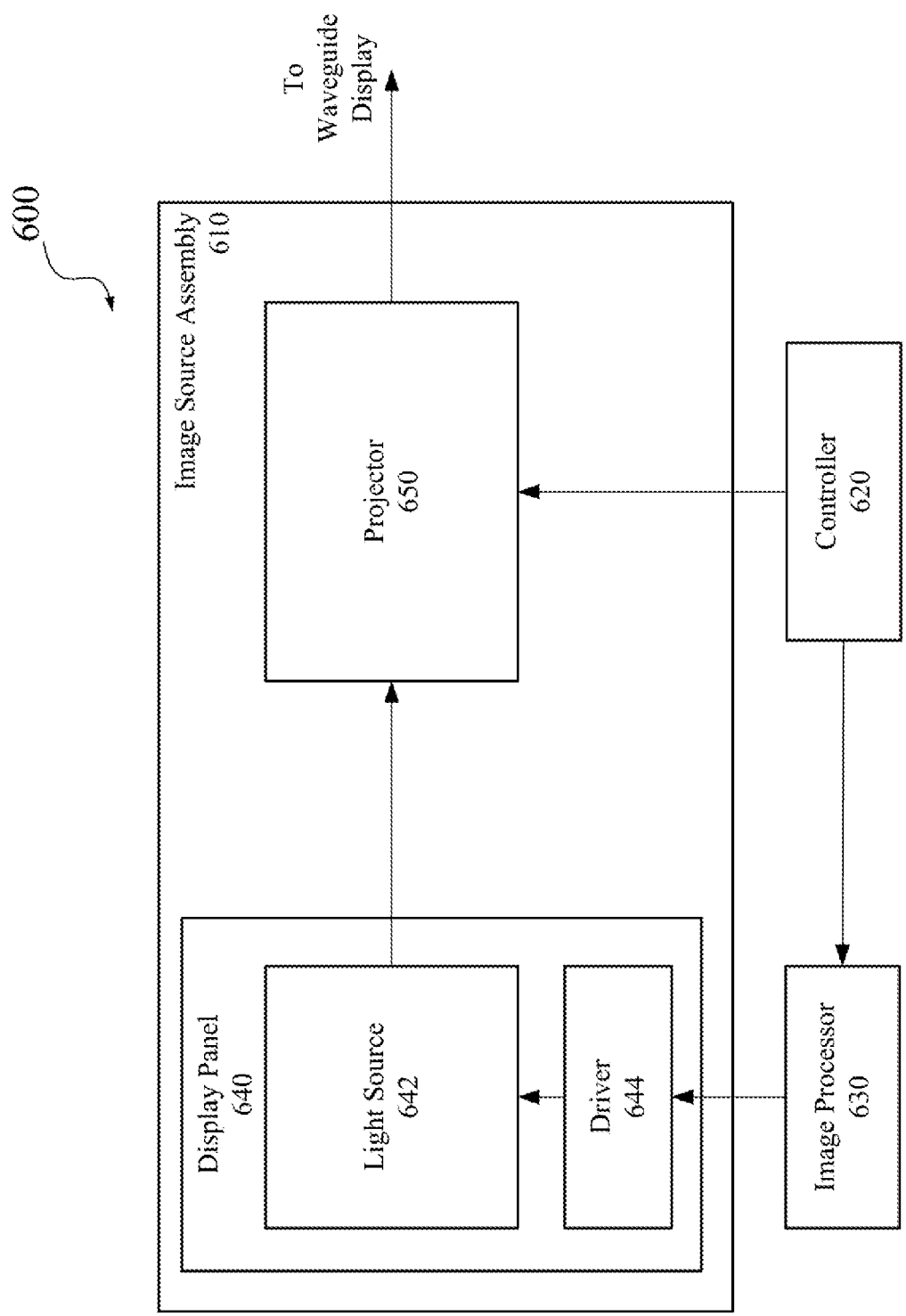
FIG. 6 illustrates an example of an image source assembly in an augmented reality system according to certain embodiments.

FIG. 6 illustrates an example of an image source assembly 610 in a near-eye display system 600 according to certain embodiments. Image source assembly 610 may include, for example, a display panel 640 that may generate display images to be projected to the user's eyes, and a projector 650 that may project the display images generated by display panel 640 to a waveguide display as described above with respect to FIGS. 4-5B. Display panel 640 may include a light source 642 and a driver circuit 644 for light source 642. Light source 642 may include, for example, light source 510 or 540. Projector 650 may include, for example, freeform optical element 560, scanning mirror 570, and/or projection optics 520 described above. Near-eye display system 600 may also include a controller 620 that synchronously controls light source 642 and projector 650 (e.g., scanning mirror 570). Image source assembly 610 may generate and output an image light to a waveguide display (not shown in FIG. 6), such as waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of near-eye display system 600. In some embodiments, a display panel in accordance with an embodiment may use more than three primary colors. Each pixel in light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

Controller 620 may control the image rendering operations of image source assembly 610, such as the operations of light source 642 and/or projector 650. For example, controller 620 may determine instructions for image source assembly 610 to render one or more display images. The instructions may include display instructions and scanning instructions. In some embodiments, the display instructions may include an image file (e.g., a bitmap file). The display instructions may be received from, for example, a console, such as console 110 described above with respect to FIG. 1. The scanning instructions may be used by image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. Controller 620 may include a combination of hardware, software, and/or firmware not shown here so as not to obscure other aspects of the present disclosure.

In some embodiments, controller 620 may be a graphics processing unit (GPU) of a display device. In other embodiments, controller 620 may be other kinds of processors. The operations performed by controller 620 may include taking content for display and dividing the content into discrete sections. Controller 620 may provide to light source 642 scanning instructions that include an address corresponding to an individual source element of light source 642 and/or an electrical bias applied to the individual source element. Controller 620 may instruct light source 642 to sequentially present the discrete sections using light emitters corresponding to one or more rows of pixels in an image ultimately displayed to the user. Controller 620 may also instruct projector 650 to perform different adjustments of the light. For example, controller 620 may control projector 650 to scan the discrete sections to different areas of a coupling element of the waveguide display (e.g., waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

Image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, image processor 630 may be one or more circuits that are dedicated to performing certain features. While image processor 630 in FIG. 6 is shown as a stand-alone unit that is separate from controller 620 and driver circuit 644, image processor 630 may be a sub-unit of controller 620 or driver circuit 644 in other embodiments. In other words, in those embodiments, controller 620 or driver circuit 644 may perform various image processing functions of image processor 630. Image processor 630 may also be referred to as an image processing circuit.

In the example shown in FIG. 6, light source 642 may be driven by driver circuit 644, based on data or instructions (e.g., display and scanning instructions) sent from controller 620 or image processor 630. In one embodiment, driver circuit 644 may include a circuit panel that connects to and mechanically holds various light emitters of light source 642. Light source 642 may emit light in accordance with one or more illumination parameters that are set by the controller 620 and potentially adjusted by image processor 630 and driver circuit 644. An illumination parameter may be used by light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by light source 642 may include multiple beams of red light, green light, and blue light, or any combination thereof.

Projector 650 may perform a set of optical functions, such as focusing, combining, conditioning, or scanning the image light generated by light source 642. In some embodiments, projector 650 may include a combining assembly, a light conditioning assembly, or a scanning mirror assembly. Projector 650 may include one or more optical components that optically adjust and potentially re-direct the light from light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of projector 650 may include, for example, lenses, mirrors, apertures, gratings, or any combination thereof.

Projector 650 may redirect image light via its one or more reflective and/or refractive portions so that the image light is projected at certain orientations toward the waveguide display. The location to which the image light is redirected may depend on specific orientations of the one or more reflective and/or refractive portions. In some embodiments, projector 650 includes a single scanning mirror that scans in at least two dimensions. In other embodiments, projector 650 may include a plurality of scanning mirrors that each scan in directions orthogonal to each other. Projector 650 may perform a raster scan (horizontally or vertically), a bi-resonant scan, or any combination thereof. In some embodiments, projector 650 may perform a controlled vibration along the horizontal and/or vertical directions with a specific frequency of oscillation to scan along two dimensions and generate a two-dimensional projected image of the media presented to user's eyes. In other embodiments, projector 650 may include a lens or prism that may serve similar or the same function as one or more scanning mirrors. In some embodiments, image source assembly 610 may not include a projector, where the light emitted by light source 642 may be directly incident on the waveguide display.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

The external quantum efficiency may be proportional to the injection efficiency, the internal quantum efficiency, and the extraction efficiency. The injection efficiency refers to the proportion of electrons passing through the device that are injected into the active region. The extraction efficiency is the proportion of photons generated in the active region that escape from the device. For LEDs, and in particular, micro-LEDs with reduced physical dimensions, improving the internal and external quantum efficiency and/or controlling the emission spectrum may be challenging. In some embodiments, to increase the light extraction efficiency, a mesa that includes at least some of the layers of semiconductor materials may be formed.

Figure 7A:
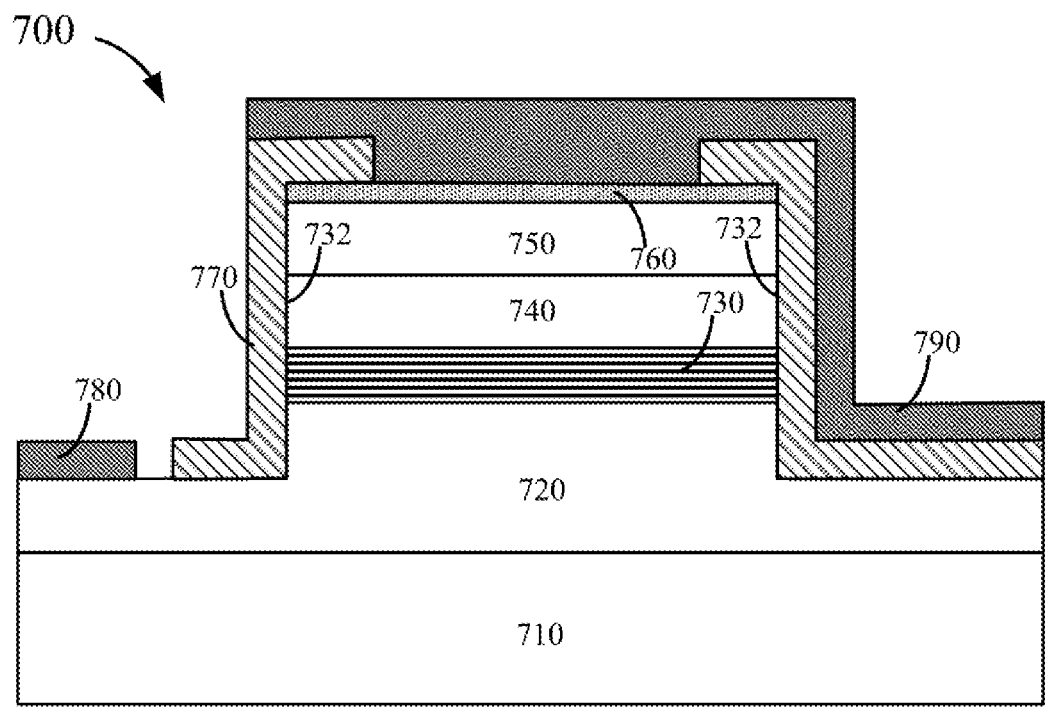
FIG. 7A illustrates an example of a light emitting diode (LED) having a vertical mesa structure according to certain embodiments.

FIG. 7A illustrates an example of an LED 700 having a vertical mesa structure. LED 700 may be a light emitter in light source 510, 540, or 642. LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, LED 700 may include a substrate 710, which may include, for example, a sapphire substrate or a GaN substrate. A semiconductor layer 720 may be grown on substrate 710. Semiconductor layer 720 may include a III-V material, such as GaN, and may be p-doped (e.g., with Mg, Ca, Zn, or Be) or n-doped (e.g., with Si or Ge). One or more active layers 730 may be grown on semiconductor layer 720 to form an active region. Active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on active layer 730. Semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. Semiconductor layer 720 and semiconductor layer 740 sandwich active layer 730 to form the light emitting region. For example, LED 700 may include a layer of InGaN situated between a layer of p-type GaN doped with magnesium and a layer of n-type GaN doped with silicon or oxygen. In some embodiments, LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between active layer 730 and at least one of semiconductor layer 720 or semiconductor layer 740. The EBL may reduce the electron leakage current and improve the efficiency of the LED. In some embodiments, a heavily-doped semiconductor layer 750, such as a $P^+$ or $P^{++}$ semiconductor layer, may be formed on semiconductor layer 740 and act as a contact layer for forming an ohmic contact and reducing the contact impedance of the device. In some embodiments, a conductive layer 760 may be formed on heavily-doped semiconductor layer 750. Conductive layer 760 may include, for example, an indium tin oxide (ITO) or Al/Ni/Au film. In one example, conductive layer 760 may include a transparent ITO layer.

To make contact with semiconductor layer 720 (e.g., an n-GaN layer) and to more efficiently extract light emitted by active layer 730 from LED 700, the semiconductor material layers (including heavily-doped semiconductor layer 750, semiconductor layer 740, active layer 730, and semiconductor layer 720) may be etched to expose semiconductor layer 720 and to form a mesa structure that includes layers 720-760. The mesa structure may confine the carriers within the device. Etching the mesa structure may lead to the formation of mesa sidewalls 732 that may be orthogonal to the growth planes. A passivation layer 770 may be formed on sidewalls 732 of the mesa structure. Passivation layer 770 may include an oxide layer, such as a $SiO_2$ layer, and may act as a reflector to reflect emitted light out of LED 700. A contact layer 780, which may include a metal layer, such as Al, Au, Ni, Ti, or any combination thereof, may be formed on semiconductor layer 720 and may act as an electrode of LED 700. In addition, another contact layer 790, such as an Al/Ni/Au metal layer, may be formed on conductive layer 760 and may act as another electrode of LED 700.

When a voltage signal is applied to contact layers 780 and 790, electrons and holes may recombine in active layer 730, where the recombination of electrons and holes may cause photon emission. The wavelength and energy of the emitted photons may depend on the energy bandgap between the valence band and the conduction band in active layer 730. For example, InGaN active layers may emit green or blue light, AlGaN active layers may emit blue to ultraviolet light, while AlInGaP active layers may emit red, orange, yellow, or green light. The emitted photons may be reflected by passivation layer 770 and may exit LED 700 from the top (e.g., conductive layer 760 and contact layer 790) or bottom (e.g., substrate 710).

In some embodiments, LED 700 may include one or more other components, such as a lens, on the light emission surface, such as substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
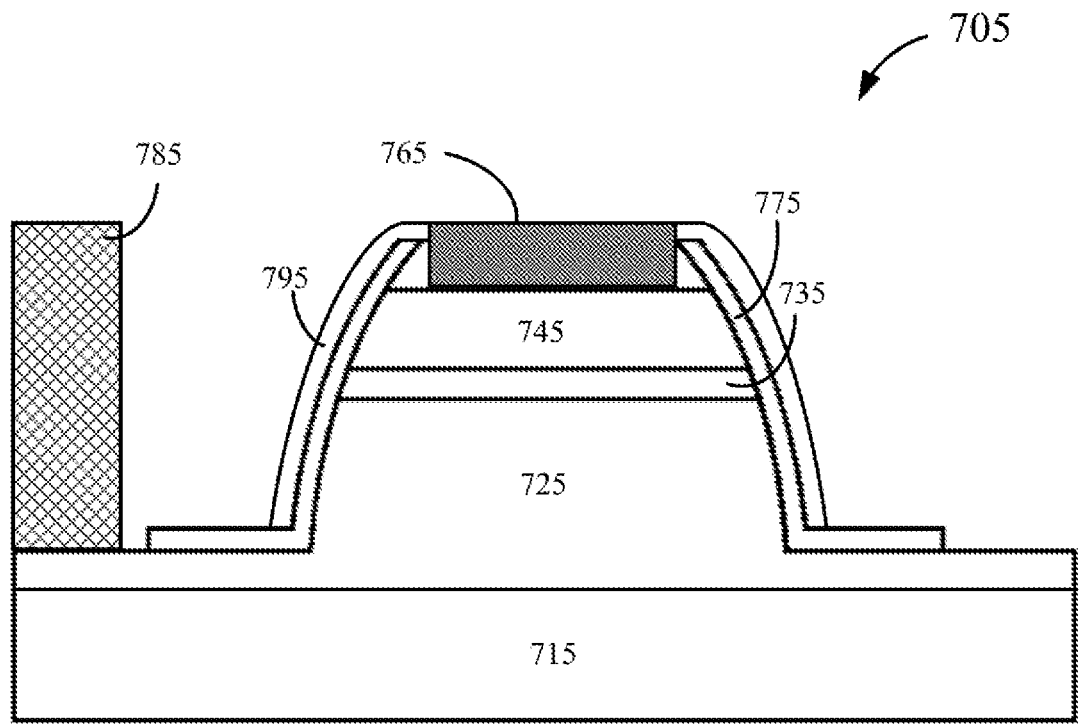
FIG. 7B is a cross-sectional view of an example of an LED having a parabolic mesa structure according to certain embodiments.

FIG. 7B is a cross-sectional view of an example of an LED 705 having a parabolic mesa structure. Similar to LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on substrate 715. Semiconductor layer 725 may include a III-V material, such as GaN, and may be p-doped (e.g., with Mg, Ca, Zn, or Be) or n-doped (e.g., with Si or Ge). One or more active layer 735 may be grown on semiconductor layer 725. Active layer 735 may include III-V materials, such as one or more InGaN layers, one or more AlInGaP layers, and/or one or more GaN layers, which may form one or more heterostructures, such as one or more quantum wells. A semiconductor layer 745 may be grown on active layer 735. Semiconductor layer 745 may include a III-V material, such as GaN, and may be p-doped (e.g., with Mg, Ca, Zn, or Be) or n-doped (e.g., with Si or Ge). One of semiconductor layer 725 and semiconductor layer 745 may be a p-type layer and the other one may be an n-type layer.

To make contact with semiconductor layer 725 (e.g., an n-type GaN layer) and to more efficiently extract light emitted by active layer 735 from LED 705, the semiconductor layers may be etched to expose semiconductor layer 725 and to form a mesa structure that includes layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of layers 725-745.

As shown in FIG. 7B, LED 705 may have a mesa structure that includes a flat top. A dielectric layer 775 (e.g., $SiO_2$ or SiNx) may be formed on the facets of the mesa structure. In some embodiments, dielectric layer 775 may include multiple layers of dielectric materials. In some embodiments, a metal layer 795 may be formed on dielectric layer 775. Metal layer 795 may include one or more metal or metal alloy materials, such as aluminum (Al), silver (Ag), gold (Au), platinum (Pt), titanium (Ti), copper (Cu), or any combination thereof. Dielectric layer 775 and metal layer 795 may form a mesa reflector that can reflect light emitted by active layer 735 toward substrate 715. In some embodiments, the mesa reflector may be parabolic-shaped to act as a parabolic reflector that may at least partially collimate the emitted light.

Electrical contact 765 and electrical contact 785 may be formed on semiconductor layer 745 and semiconductor layer 725, respectively, to act as electrodes. Electrical contact 765 and electrical contact 785 may each include a conductive material, such as Al, Au, Pt, Ag, Ni, Ti, Cu, or any combination thereof (e.g., Ag/Pt/Au or Al/Ni/Au), and may act as the electrodes of LED 705. In the example shown in FIG. 7B, electrical contact 785 may be an n-contact, and electrical contact 765 may be a p-contact. Electrical contact 765 and semiconductor layer 745 (e.g., a p-type semiconductor layer) may form a back reflector for reflecting light emitted by active layer 735 back toward substrate 715. In some embodiments, electrical contact 765 and metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across contacts 765 and 785, electrons and holes may recombine in active layer 735. The recombination of electrons and holes may cause photon emission, thus producing light. The wavelength and energy of the emitted photons may depend on the energy bandgap between the valence band and the conduction band in active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit LED 705, for example, from the bottom side (e.g., substrate 715) shown in FIG. 7B. One or more other secondary optical components, such as a lens or a grating, may be formed on the light emission surface, such as substrate 715, to focus or collimate the emitted light and/or couple the emitted light into a waveguide.

One or two-dimensional arrays of the LEDs described above may be manufactured on a wafer to form light sources (e.g., light source 642). Driver circuits (e.g., driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

In semiconductor LEDs, photons are usually generated at a certain internal quantum efficiency through the recombination of electrons and holes within an active region (e.g., one or more semiconductor layers), where the internal quantum efficiency is the proportion of the radiative electron-hole recombination in the active region that emits photons. The generated light may then be extracted from the LEDs in a particular direction or within a particular solid angle. The ratio between the number of emitted photons extracted from an LED and the number of electrons passing through the LED is referred to as the external quantum efficiency, which describes how efficiently the LED converts injected electrons to photons that are extracted from the device.

As described above, the overall efficiency of a waveguide-based display system may be the product of the efficiency of individual components in the display system and may also depend on how the components are coupled together. In a simplified example, the overall efficiency $\eta_{tot}$ of a waveguide-based display system may be determined as $\eta_{tot} = \eta_{EQE} \times \eta_{in} \times \eta_{out}$, where $\eta_{EQE}$ is the external quantum efficiency of a micro-LED, $\eta_{in}$ is the in-coupling efficiency of display light from the micro-LED into the waveguide, and $\eta_{out}$ is the out-coupling efficiency of the display light from the waveguide towards the user's eye. Thus, the overall efficiency $\eta_{tot}$ can be improved by improving one or more of $\eta_{EQE}$, $\eta_{in}$, and $\eta_{out}$.

Figure 8B:
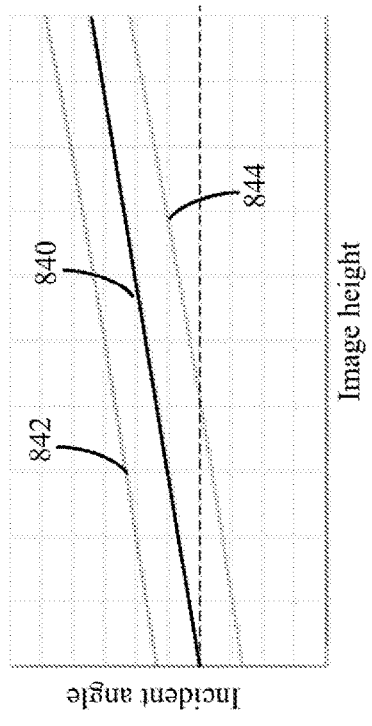
FIG. 8B illustrates angles of light incident on the display optics from the linear micro-LED array according to certain embodiments.
Figure 8D:
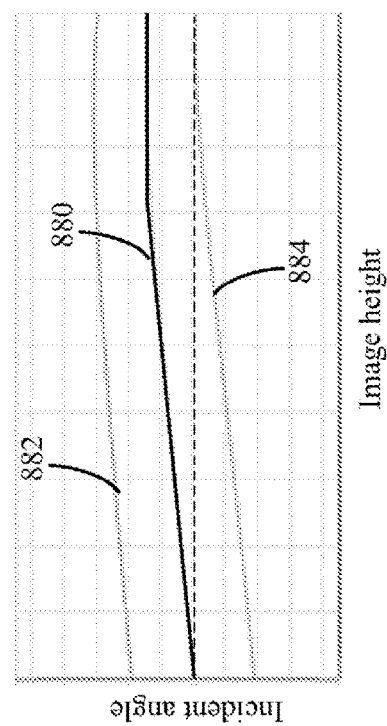
FIG. 8D illustrates angles of light incident on the display optics from the curved micro-LED array according to certain embodiments.
Figure 8A:
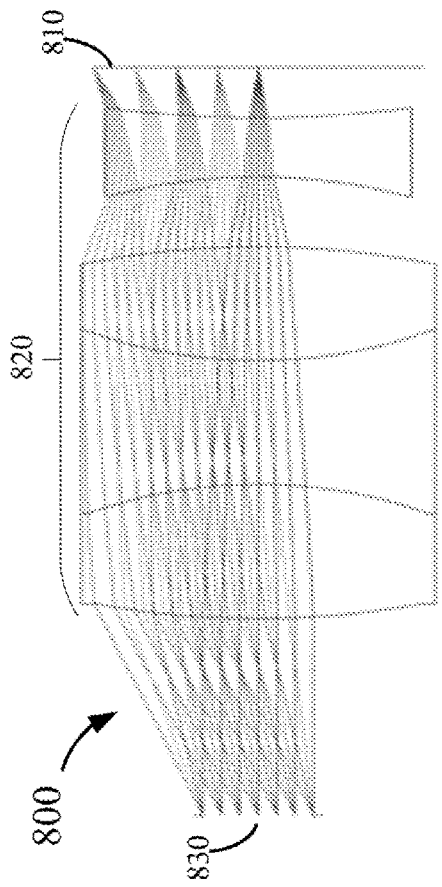
FIG. 8A illustrates an example of a micro-LED-based display system including a linear micro-LED array and display optics according to certain embodiments.

FIG. 8A illustrates an example of a micro-LED-based display system 800 including a linear micro-LED array 810 and display optics 820 according to certain embodiments. FIG. 8B illustrates angles of light incident on display optics 820 from micro-LED array 810 according to certain embodiments. As illustrated in the example, due to the limited field of view (or acceptance angle) and/or the size of exit pupil (or eyebox) of display system 800, different angular portions of light from the respective micro-LEDs in micro-LED array 810 may pass through an exit pupil 830 of display system 800. For example, as shown by a line 840 in FIG. 8B, the chief ray of the light beam from a micro-LED at the center of micro-LED array 810 that may reach the user's eyes may be incident on display optics 820 at about 0°, while the chief ray of the light beam from a micro-LED at the edge of micro-LED array 810 that may reach the user's eyes may be incident on display optics 820 at about 20°. Lines 842 and 844 show the angular range of the light from each micro-LED at a respective height in micro-LED array 810 that can reach the user's eyes. When the light intensity of the light beam from each micro-LED is not uniform in each direction (such as having a narrow beam profile), light from different micro-LEDs may be projected to the user's eyes at different efficiencies due to the different angular portions of light from the respective micro-LEDs in micro-LED array 810 that pass through exit pupil 830. As such, the picture displayed to the user may have a non-uniform intensity. In some embodiments, in order to compensate for the chief ray walk-off described above, the micro-LED array may be arranged on a curved surface.

Figure 8C:
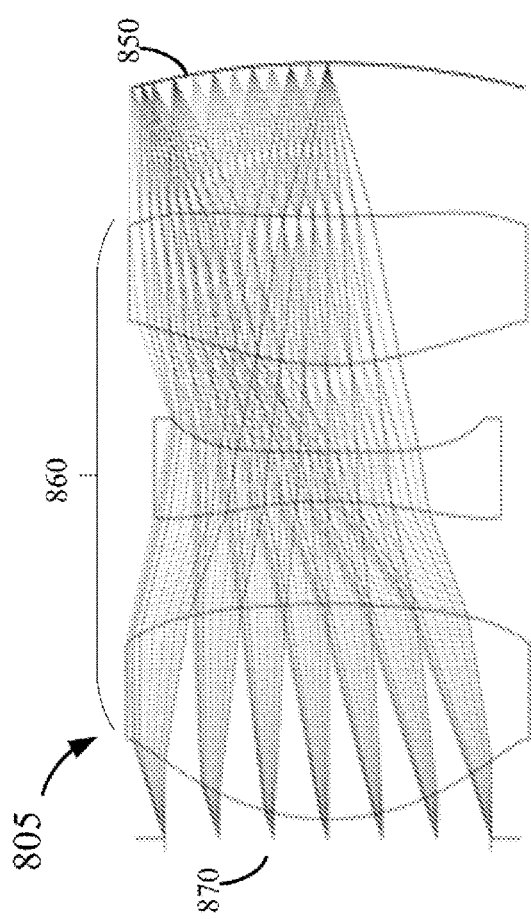
FIG. 8C illustrates an example of a micro-LED-based display system including a curved micro-LED array and display optics according to certain embodiments.

FIG. 8C illustrates an example of a micro-LED-based display system 805 including a curved micro-LED array 850 and display optics 860 according to certain embodiments. FIG. 8D illustrates angles of light incident on display optics 860 from micro-LED array 850 according to certain embodiments. As illustrated in the example, due to the limited field of view (or acceptance angle) and/or the size of exit pupil (or eyebox) of display system 805, different angular portions of light from the respective micro-LEDs in micro-LED array 850 may pass through an exit pupil 870 of display system 805. For example, as shown by a line 880 in FIG. 8D, the chief ray of the light beam from a micro-LED at the center of micro-LED array 850 that may reach the user's eyes may be incident on display optics 860 at about 0°, while the chief ray of the light beam from a micro-LED at the edge of micro-LED array 850 that may reach the user's eyes may be incident on display optics 860 at about 10° or lower, which is much lower than the incident angle shown in FIGS. 8A and 8B. In addition, in the example shown in FIGS. 8C and 8D, the chief ray may walk off at a lower rate (shown by the lower slope of line 880) compared with the chief ray shown in FIGS. 8A and 8B. Lines 882 and 884 show the angular range of the light from each micro-LED at a respective height in micro-LED array 850 that can reach the user's eyes. Because the chief ray walk-off is reduced, the angular range of the light from each micro-LED at a respective height in micro-LED array 850 that can reach the user's eyes, and thus the in-coupling efficiency, may be relatively uniform for micro-LEDs in micro-LED array 850. However, micro-LED array 850 may be difficult to manufacture.

The light coupling efficiencies and the uniformity of the light coupling efficiencies for micro-LEDs in a micro-LED array in a display system may also be affected by the beam profile of the light beam emitted by the micro-LEDs. For example, for a display system with a limited acceptance angle (e.g., with a half width half magnitude (HWHM) angle less than 20°), if the light beam has a wide beam profile (e.g., a Lambertian emission profile), a small portion of the total light emitted by a micro-LED may be captured by the display optics and delivered to the user's eyes, even though the light coupling efficiencies for the micro-LEDs in the micro-LED array may be relatively uniform.

Figures 9A, 9B:
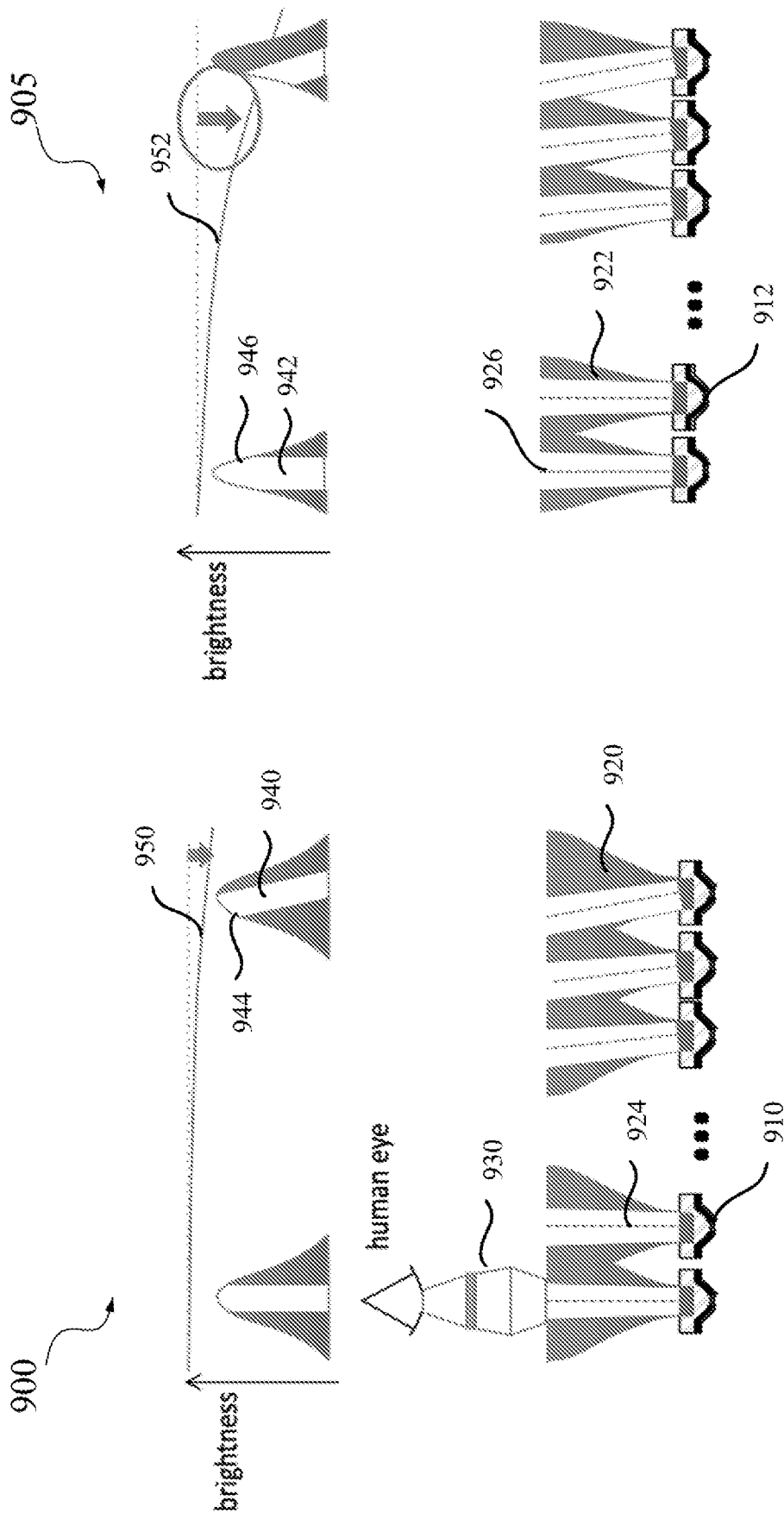
FIG. 9A illustrates uniformity and brightness of light extracted from a micro-LED array having broad beam profiles according to certain embodiments.
FIG. 9B illustrates uniformity and brightness of light extracted from a micro-LED array having narrow beam profiles according to certain embodiments.

FIG. 9A illustrates uniformity and brightness of light extracted from a micro-LED array 910 having broad beam profiles in an example of a display system 900 according to certain embodiments. In the example shown in FIG. 9A, each micro-LED in micro-LED array 910 may have a linear dimension of, for example, about 3 μm, and may include a mesa structure. Due to the small dimension and the mesa structure, the beam profile of a light beam 920 emitted from each micro-LED in micro-LED array 910 may have an HWHM angle of, for example, about 40°. Due to the limited acceptance angles (e.g., within about ±10°) and/or the limited size of the exit pupil of display system 900, only a portion 924 of each light beam 920 may reach a user's eye through display optics 930. In addition, due to the chief way walk-off described above, the portion 924 of each light beam 920 that can reach the user's eyes may be within a different respective angular range for each respective micro-LED as shown in FIG. 9A. The total power of each light beam 920 may be indicated by the area below a curve 944 that represents the beam brightness profile of light beam 920, while the total power of each light beam 920 that may reach the user's eye may be indicated by the total area of a region 940 below curve 944, which may only be a small fraction of the total area below curve 944. However, because of the broad beam profile, the brightness of the light beam that can reach the user's eyes may not decrease much within the respective angular range. In other words, the area of region 940 may be relatively uniform for the micro-LEDs in micro-LED array 910. Thus, the coupling efficiency for the micro-LEDs in micro-LED array 910 may be relative uniform as shown by a curve 950. For example, the light coupling efficiency for micro-LEDs with Lambertian beam profiles may remain constant in a display system with a small acceptance angle (e.g., within ±10-20°) and a chief ray walk-off from 0° to about 20°.

FIG. 9B illustrates uniformity and brightness of light extracted from a micro-LED array 912 having narrow beam in an example of a display system 905 according to certain embodiments. Each micro-LED in micro-LED array 910 may have a linear dimension of, for example, about 3 μm. The beam profile of a light beam 922 emitted from each micro-LED in micro-LED array 912 may have an HWHM angle of, for example, about 15°. Due to the limited acceptance angles (e.g., within about ±10°) and/or the limited size of the exit pupil of display system 905, only a portion 926 of each light beam 922 may reach a user's eye through the display optics. In addition, due to the chief way walk-off described above, the portion 926 of each light beam 922 that may reach the user's eyes may be within a different respective angular range for each respective micro-LED as shown in FIG. 9B. The total power of each light beam 922 may be indicated by the area below a curve 946 that represents the brightness profile of light beam 922, while the total power of each light beam 922 that can reach the user's eye may be indicated by the area of a region 942 below curve 946, which may only be a portion of the total area below curve 946. Because of the narrow beam profile of light beam 922, the area of region 942 may be a large portion of the total area below curve 946 for micro-LEDs at the center of micro-LED array 912, and thus the coupling efficiencies may be high for micro-LEDs at the center of micro-LED array 912. However, for micro-LEDs at the edge of micro-LED array 912, the area of region 942 may only be a small portion of the total area below curve 946. In other words, the area of region 942, and thus the coupling efficiency of the micro-LEDs in micro-LED array 910, may decrease significantly from the center to the edges of micro-LED array 910 as shown by a curve 952.

In some embodiments, to increase the external quantum efficiency (e.g., the light extraction efficiency), one or more other optical components (e.g., a micro-lens), in addition to the mesa structure and reflector described above, may be formed on the light emission surface, such as substrate 710 or 710', to extract the emitted light within a certain solid angle out of an LED, and/or to focus or collimate the emitted light. For example, in some embodiments, a micro-lens array may be formed on a micro-LED array, where the light emitted from each micro-LED may be collected and extracted by a corresponding micro-lens, and may be collimated, focused, or expanded, and then directed to a waveguide in a waveguide-based display system. The micro-lenses may help to increase the acceptance angle and improve the light extraction efficiency and coupling efficiency. In some embodiments, to improve the coupling efficiency of display light from the micro-LED into user's eyes through a waveguide-based display system, it may also be desirable that the light from each micro-LED is directed to the waveguide at a different respective angle. The light emitted from the micro-LEDs can be redirected to desired directions using, for example, micro-lenses, wedges or prisms, gratings, or the like.

Figure 10:
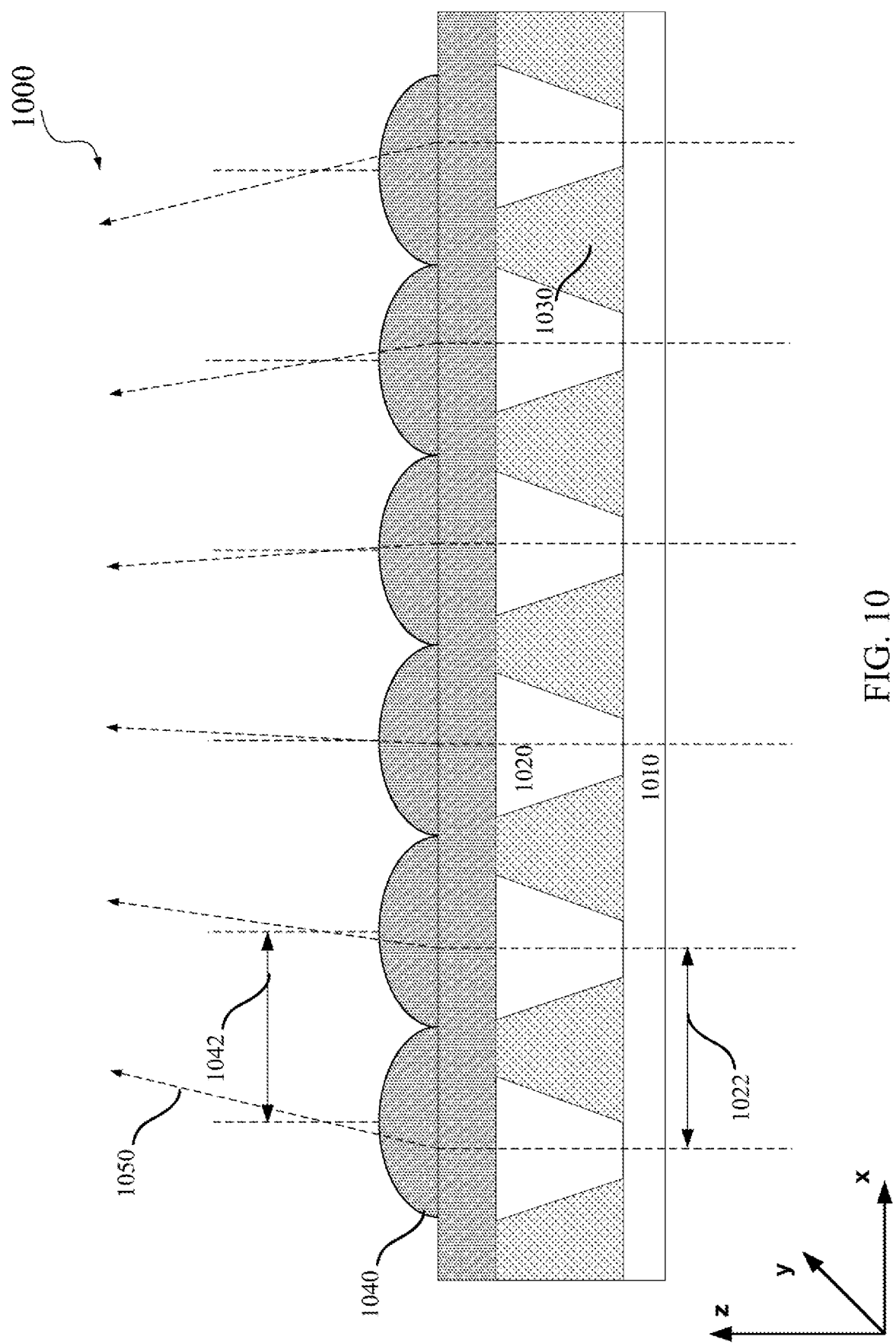
FIG. 10 illustrates an example of a device including a micro-LED array and an array of micro-lenses for light extraction and chief ray angle modification according to certain embodiments.

FIG. 10 illustrates an example of a device 1000 including a micro-LED array 1020 and a micro-lens array 1040 for extracting and converging light from micro-LED array 1020 according to certain embodiments. Micro-LED array 1020 may include a one-dimensional or two-dimensional array of micro-LEDs having vertical, conical, parabolic, or other mesa structures. The micro-LEDs may be uniformly distributed and may be separated by insulators 1030. Micro-LED array 1020 may include epitaxial structures formed on a substrate 1010 as described above with respect to, for example, FIGS. 7A and 7B. Insulators 1030 may include, for example, passivation layers (e.g., passivation layer 770), light reflection layers, filling materials (e.g., polymers), and the like.

Micro-lens array 1040 may be formed directly on micro-LED array 1020 or may be formed on a substrate and then bonded to micro-LED array 1020. For example, micro-lens array 1040 may be etched in a dielectric layer or a semiconductor layer of micro-LED array 1020, such as a substrate or an oxide layer (e.g., a $SiO_2$ layer) of micro-LED array 1020, or may be formed on a dielectric layer deposited on micro-LED array 1020, such as an oxide layer or a polymer layer, as described in detail below. The focal length and the distance of the micro-lenses from the corresponding micro-LEDs may be configured such that light beam from each micro-lens may be a collimated beam, a converging beam, or a diverging beam.

A pitch 1022 of micro-LED array 1020 may be different from (e.g., less than or greater than) a pitch 1042 of micro-lens array 1040, and thus the optical axis of each micro-lens in micro-lens array 1040 may be offset from the center of a respective micro-LED in micro-LED array 1020 by a different distance. As such, the chief ray 1050 of the light from each micro-LED after passing through the corresponding micro-lens may be different. In the example shown in FIG. 10, pitch 1022 of micro-LED array 1020 may be greater than pitch 1042 of micro-lens array 1040, and thus the optical axis of each micro-lens in micro-lens array 1040 may be offset from the center of a respective micro-LED in micro-LED array 1020 by a different distance. The offset may be a function of the location of the micro-lens. For example, the offset may linearly increase as a function of the distance of the micro-lens from the center of device 1000. As a result, the chief rays 1050 of the light extracted from the micro-LEDs after passing through the corresponding micro-lenses may be in different propagation directions and may converge as shown in the example.

Because of the chief ray direction modification by micro-lens array 1040, the portion of the light that may reach the user's eyes from each micro-LED in micro-LED array 1020 may be substantially the same, which may be the portion of the light beam that has the highest intensity or brightness. Therefore, both the coupling efficiencies and the uniformity of the coupling efficiencies may be improved for the micro-LEDs in micro-LED array 1020.

In various embodiments, the pitch of micro-lens array may be uniform or non-uniform. For example, the pitch of a two-dimensional micro-lens array may be uniform in two orthogonal directions, uniform in one direction only, or non-uniform in both directions. The pitch may also be the same or different in the two orthogonal directions. The pitch of the micro-lens array may be different from the pitch of the micro-LED array in one or two dimensions. However, as described above, it may be difficult to precisely, reliably, and efficiently manufacture the three-dimensional surface structures, such as the micro-lens array.

According to certain embodiments, planar optical components may be formed in a plurality of semiconductor layers epitaxially grown on light emitting devices. The plurality of semiconductor layers may each have a respective composition and may be laterally oxidized (or etched) at different rates to form different oxide regions with a different refractive index and thus the desired optical path length (OPL) profiles of various planar optical components. For illustration purposes, several embodiments of planar optical components for modifying light beam properties, such as beam divergence, beam direction, or both, and techniques for manufacturing the planar optical components are described below. Some common elements of wafer-level light sources (e.g., micro-LEDs and VCSELs) may be omitted in the figures, including epitaxial structures formed on a substrate as described above with respect to, for example, FIGS. 7A and 7B. The structures depicted in the examples are not meant to be restrictive, but rather illustrative of certain embodiments. Light emitting structures may include, for example, insulators as described in reference to FIG. 10, and may be formed as mesas having structures including, but not limited to, vertical, parabolic, and conical shapes, as described in reference to FIGS. 7A and 7B. In addition, while some examples may include micro-LEDs and VCSEL structures, embodiments of the present disclosure may include other wafer level light emitting structures, including, but not limited to, LEDs and RCLEDs.

Figures 11A, 11B, 11C:
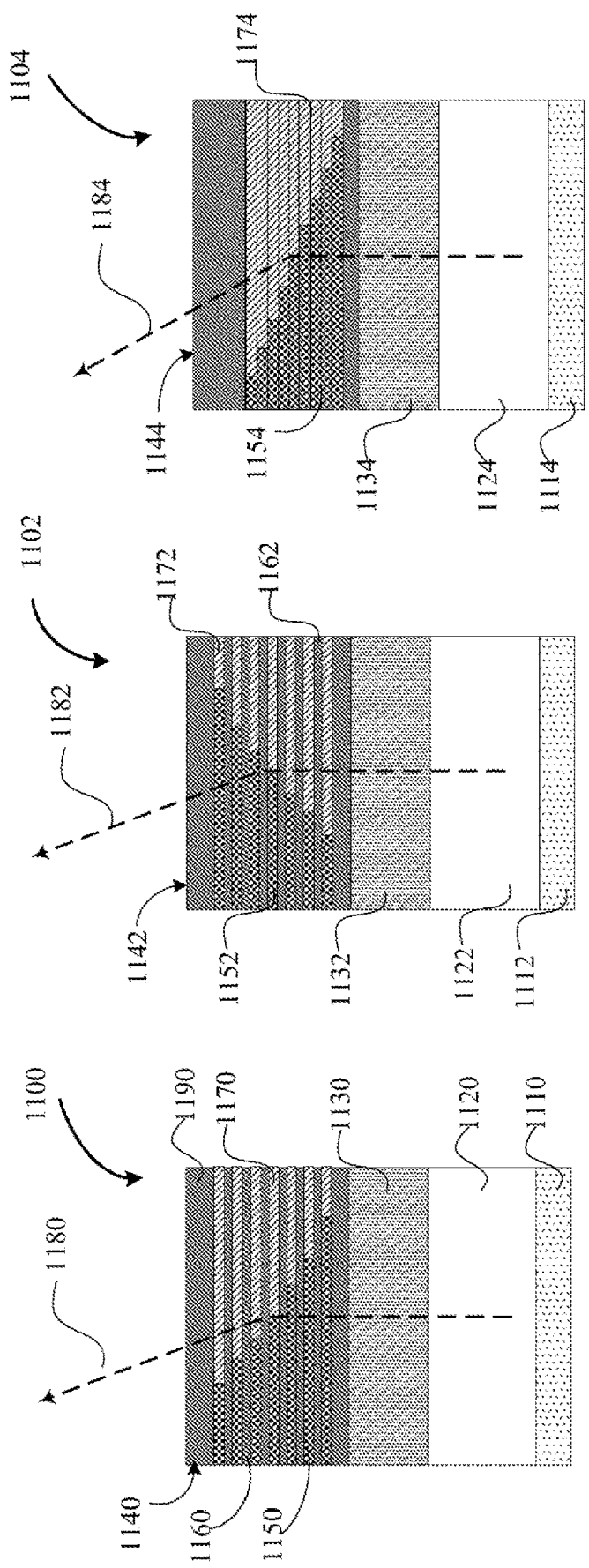
FIG. 11A illustrates an example of a light source including a surface-emitting light emitting device and a planar optical component according to certain embodiments.
FIG. 11B illustrates another example of a light source including a surface-emitting light emitting device and a planar optical component according to certain embodiments.
FIG. 11C illustrates yet another example of a light source including a surface-emitting light emitting device and a planar optical component according to certain embodiments.

FIG. 11A illustrates an example of a light source 1100 including a surface-emitting light emitting device and a planar optical component 1140 according to certain embodiments. In the example shown in FIG. 11A, the surface-emitting light emitting device may include a bottom layer 1110 (e.g., an n-doped layer), an active layer 1120, and a top layer 1130 (e.g., a p-doped layer). Planar optical component 1140 may be disposed on top layer 1130, and may include one or more semiconductor layers 1150. Planar optical component 1140 may include a semiconductor material that is transparent to the light emitted from the surface-emitting light emitting device. Planar optical component 1140 may also include a layer 1190 that may be resistant to oxidation and may be used to prevent vertical oxidation.

In some embodiments, the surface-emitting light emitting device may be bottom-emitting, where a planar optical component (not shown in FIG. 11A) may be formed on bottom layer 1110. In some embodiments, planar optical component 1140 may include one or more interleaved semiconductor layers 1160 grown alternately with semiconductor layers 1150. In some embodiments, planar optical component 1140, semiconductor layers 1150, and interleaved semiconductor layers 1160 may be transparent or at least partially transparent to light emitted from active layer 1120, and may each be characterized by a respective refractive index value. Semiconductor layers 1150 and interleaved semiconductor layers 1160 may have similar refractive indices or different refractive indices. In some embodiments, the thicknesses and the refractive indices of semiconductor layers 1150 and interleaved semiconductor layers 1160 may be selected such that semiconductor layers 1150 and interleaved semiconductor layers 1160 may form an antireflection structure for the light emitted from active layer 1120. In some embodiments, the thickness of each semiconductor layer 1150 may be the same or different across the one or more semiconductor layers.

In some embodiments, each semiconductor layer 1150 may include a material having the chemical composition $Al_xGa_{1-x}As$, where x is the molar fraction of aluminum relative to gallium in each semiconductor layer 1150. $Al_xGa_{1-x}As$ may have a refractive index about 3 for near-infrared light at 1000 nm. In some embodiments, semiconductor layers 1150 in planar optical component 1140 may be formed on the light-emitting side (e.g., top layer 1130) of surface-emitting light emitting device in a layered deposition process, such as epitaxial growth. The epitaxial growth may be performed using, for example, Molecular-beam epitaxy (MBE), Chemical Vapor Deposition (CVD), Metal-Organic Chemical Vapor Deposition (MOCVD), or Liquid Phase Epitaxy (LPE). The composition of each semiconductor layer 1150 may be different, for example, with x in $Al_xGa_{1-x}As$ between about 0.7 and about 1.0 (e.g., $Al_{0.8}Ga_{0.2}As$), such that each semiconductor layer 1150 may be susceptible to a different respective oxidation rate. The composition of each semiconductor layer 1150 may be achieved through the epitaxial growth process or may be achieved by additional doping processes. In some embodiments, planar optical component 1140 may include one or more interleaved semiconductor layers 1160 having the chemical composition $Al_xGa_{1-x}As$, where x is between about 0.0 and about 0.7 (e.g., GaAs or $Al_{0.2}Ga_{0.8}As$), such that the interleaved semiconductor layers 1160 may have much lower oxidation rates compared with semiconductor layers 1150.

In some embodiments, the one or more semiconductor layers 1150 may include, for example, $(Al_xGa_{1-x})_{0.5}In_{0.5}P$, where x is the molar fraction of aluminum relative to gallium in each of semiconductor layers 1150, such that semiconductor layers 1150 may be laterally etched at different rates by wet etching. Other materials that may be used in semiconductor layers 1150 include, for example, (AlGaIn)AsP, (AlGaIn)NAs, (AlGaIn)N, AlInGaAsSb, or the like.

In some embodiments, the one or more semiconductor layers 1150 may be laterally oxidized from exposed sidewalls (e.g., formed by trenches etched or drilled in semiconductor layers 1150) within a certain oxidation duration, such that at least some semiconductor layers 1150 may be partially oxidized to form one or more oxide regions 1170 that may have a refractive index (e.g., about 1.7) lower than that of semiconductor layers 1150 (e.g., about 3). For example, in the example illustrated in FIG. 11A, during oxidation of semiconductor layers 1150, the oxidation may start from an exposed sidewall (e.g., the right sidewall) of planar optical component 1140, toward unexposed regions of planar optical component 1140. Due to the different compositions of semiconductor layers 1150 and the oxidation rates that may be a function of the compositions of the semiconductor layers (e.g., a function of x in $Al_xGa_{1-x}As$), oxide regions 1170 in different semiconductor layers 1150 may have different sizes or areas. As such, the volume and the lateral dimension of oxide regions 1170 after the selective oxidation treatment may be a function of the aluminum concentration in semiconductor layers 1150, the duration of the selective oxidation treatment, as well as other parameters of the selective oxidation treatment, such as temperature, oxygen pressure, and the like.

Due to the controlled oxidation period and finite oxidation rates, the oxidation may occur in certain lateral areas in planar optical component 1140, resulting in spatially variant oxidation of semiconductor layers 1150. In this way, oxide regions 1170 may form preferentially in semiconductor layers 1150 that have, for example, higher aluminum concentrations (e.g., larger x values). For example, in the example shown in FIG. 11A, the x value of $Al_xGa_{1-x}As$ in semiconductor layers 1150 may increase with the increase of the distance from the light emission surface (e.g., top layer 1130). Thus, after the oxidation treatment, oxide regions 1170 may become larger as the distance from the light emission surface increases. For example, semiconductor layers 1150 near top layer 1130 may have the lowest aluminum composition and thus the smallest oxide regions after the oxidation treatment, while semiconductor layers 1150 farther away from top layer 1130 may have higher aluminum concentrations and thus larger oxide regions after the oxidation treatment. Because oxide regions 1170 may have a different (e.g., lower) refractive index than the corresponding semiconductor layers 1150, planar optical component 1140 may have a spatially variant effective refractive index. As a result, planar optical component 1140 may function as an optical element, such as a prism, that modifies emitted light beam 1180, such as deflecting light beam 1180 to a desired direction.

FIG. 11B illustrates another example of a light source 1102 including a surface-emitting light emitting device and a planar optical component 1142 according to certain embodiments. In the example shown in FIG. 11B, the surface-emitting light emitting device may be similar to the surface-emitting light emitting device in light source 1100, and may include a bottom layer 1112 (e.g., an n-doped layer), an active layer 1122, and a top layer 1132 (e.g., a p-doped layer). Planar optical component 1142 may be disposed on top layer 1132, and may include one or more semiconductor layers 1152, which may be similar to semiconductor layers 1150. In some embodiments, planar optical component 1142 may include one or more interleaved semiconductor layers 1162 including, for example, $Al_xGa_{1-x}As$, where x may be between about 0.0 and about 0.7 (e.g., GaAs or $Al_{0.2}Ga_{1-x}As$), such that the interleaved semiconductor layers 1162 may have much lower oxidation rates compared with semiconductor layers 1152.

In light source 1102, the x value in $Al_xGa_{1-x}As$ in semiconductor layers 1152 may decrease with the increase of the distance from the light emission surface (e.g., top layer 1132), resulting in smaller oxide regions 1172 after the oxidation treatment as the distance from the light emission surface increases. For example, semiconductor layers 1152 near top layer 1132 may have the highest aluminum composition and thus the largest oxide regions after the oxidation treatment, while semiconductor layers 1152 farther away from top layer 1132 may have lower aluminum concentrations and thus smaller oxide regions after the oxidation treatment. Because oxide regions 1172 may have a different (e.g., much lower) refractive index than the corresponding semiconductor layers 1152, planar optical component 1142 may have a spatially variant effective refractive index. As a result, planar optical component 1142 may function as an optical element, such as an upside-down prism, that modifies emitted light beam 1182, such as deflecting light beam 1182 to a desired direction.

FIG. 11C illustrates another example of a light source 1104 including a surface-emitting light emitting device and a planar optical component 1144 according to certain embodiments. In light source 1104, the surface-emitting light emitting device may be similar to the surface-emitting light emitting device in light source 1100, and may include a bottom layer 1114 (e.g., an n-doped layer), an active layer 1124, and a top layer 1134 (e.g., a p-doped layer). Planar optical component 1144 may be disposed on top layer 1134, and may include one or more semiconductor layers 1154, which may be similar to semiconductor layers 1150. In the example shown in FIG. 11C, semiconductor layers 1154 may be deposited on adjacent layers, where the composition of semiconductor layers 1154 may varied continuously or stepwise, such as by step-wise increment or decrement of the supply of a particular element during the epitaxial growth.

For example, semiconductor layers 1154 may include aluminum gallium arsenide ($Al_xGa_{1-x}As$), and may be grown in a way such that the mole fraction x of aluminum in semiconductor layers 1154 may gradually increase with the increase of the distance from top layer 1134. As such, after oxidation treatment in a limited time period, oxide regions 1174 may be restricted to certain lateral areas in semiconductor layers 1154. Because of the different compositions in semiconductor layers 1154, oxide region 1174 in each semiconductor layer 1154 may have a different respective area. Due to the different (e.g., lower) refractive index of the oxide regions 1174 (e.g., about 1.7) compared to semiconductor layers 1154 (e.g., about 3), each layer in planar optical component 1144 may have a respective effective refractive index, or each lateral region in planar optical component 1144 may have a respective optical path length. Thus, planar optical component 1144 may non-uniformly modify the wavefront of the light beam emitted from the surface-emitting light emitting device. For example, planar optical component 1144 may function as a prism, and an emitted light beam 1184 may be deflected (e.g., refracted) by planar optical component 1144 to a direction different from the surface normal direction of planar optical component 1144.

Figure 12:
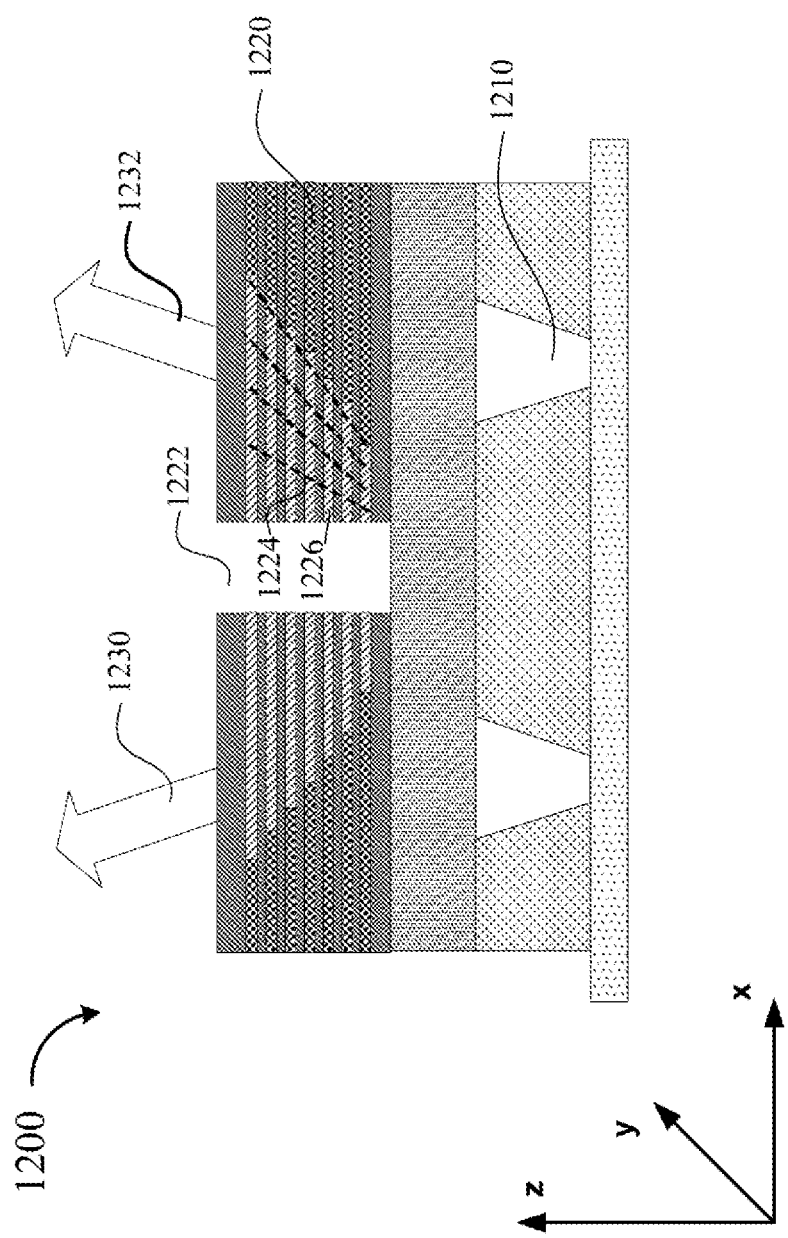
FIG. 12 illustrates an example of an array of light sources each including a surface-emitting light emitting device and a planar optical component according to certain embodiments.

FIG. 12 illustrates an example of a device 1200 including an array of light sources each including a surface-emitting light emitting device (e.g., a micro-LED 1210 or a VCSEL) and a planar optical component 1220 according to certain embodiments. Each micro-LED 1210 may be similar to the surface-emitting light emitting device described above with respect to FIGS. 11A-11C or the micro-LEDs described above with respect to FIGS. 7A and 7B. Planar optical components 1220 may be similar to planar optical components 1140, 1142, and 1144 described above, and may be formed in a plurality of planar semiconductor layers that have different compositions and thus are characterized by different lateral oxidation rates. The array of light sources may be on a wafer or a die that includes a plurality of epitaxial layers vertically grown to form a layer stack. In some embodiments, device 1200 may include an electrical circuit (e.g., a wafer including integrated circuits fabricated thereon) (not shown in FIG. 12) bonded to micro-LEDs 1210 to individually address and drive micro-LEDs 1210 in device 1200. For example, the electrical circuit may include a pulse width modulator for tuning the light intensity of the emitted light to display images to users.

To make individual planar optical components 1220 in the wafer or the die, a trench 1222 may be etched or drilled through the plurality of planar semiconductor layers that have different compositions to expose the sidewalls or edges of the plurality of planar semiconductor layers. Device 1200 may be further processed by oxidation treatment to laterally oxidize the plurality of planar semiconductor layers from the sidewalls or the edges, as described above with respect to FIGS. 11A-11C. The lateral oxidation may occur at different rates to form oxide regions 1226 of different sizes in the plurality of planar semiconductor layers during an oxidation period. Because the oxidation occurs in different directions from the sidewalls formed by trench 1222, two different planar optical components 1220 may be formed for the two micro-LEDs 1210. In the example shown in FIG. 12, the two planar optical components 1220 may direct the surface-normally emitted light beams from the two micro-LEDs 1210 to different directions as shown by light beams 1230 and 1232. Changing the oxidation time may change the refractive index profile of the planar optical components 1220 shown by lines 1224 due to the different oxidation rates of the different planar semiconductor layers, and thus may change the direction of the emitted light beam 1230 and 1232.

Figure 13A:
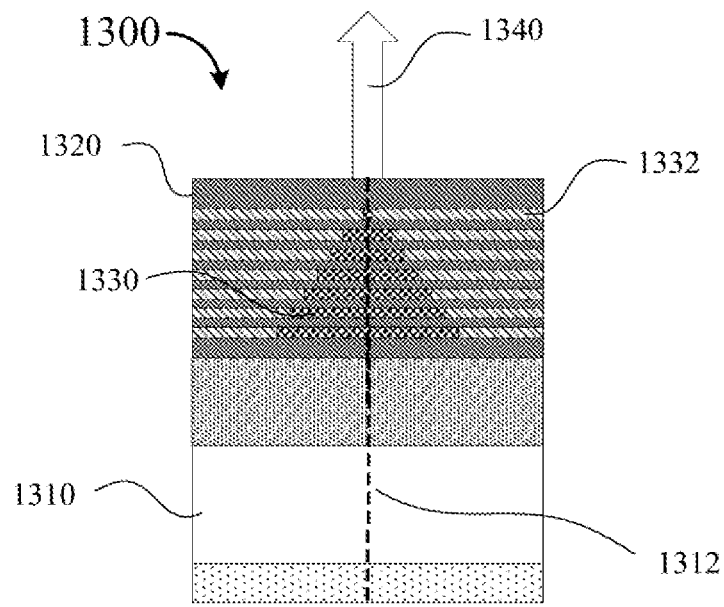
FIG. 13A illustrates an example of a light source including a surface-emitting light emitting device and a planar optical component aligned with the surface-emitting light emitting device according to certain embodiments.

FIG. 13A illustrates an example of a light source 1300 including a surface-emitting light emitting device 1310 and a planar optical component 1320 aligned with surface-emitting light emitting device 1310 according to certain embodiments. Planar optical component 1320 may be formed in one or more semiconductor layers 1330 having different lateral oxide regions 1332 after oxidation treatment, as discussed in reference to FIGS. 11A-12. In the example shown in FIG. 13A, the lateral oxidation may occur in both directions from the two sidewalls to form oxide regions 1332 that are symmetrical with respect to a center line 1312 of surface-emitting light emitting device 1310. As such, planar optical component 1320 may be symmetrical with respect to center line 1312 of surface-emitting light emitting device 1310 and thus may be laterally aligned with center line 1312 of surface-emitting light emitting device 1310. The formation of oxide regions 1332 may result in a non-uniform effective optical thickness profile in the lateral direction of planar optical component 1320, such as the optical thickness profile of a lens with a desired focal length for collimating, converging, or diverging light beam 1340 emitted by surface-emitting light emitting device 1310.

Figure 13B:
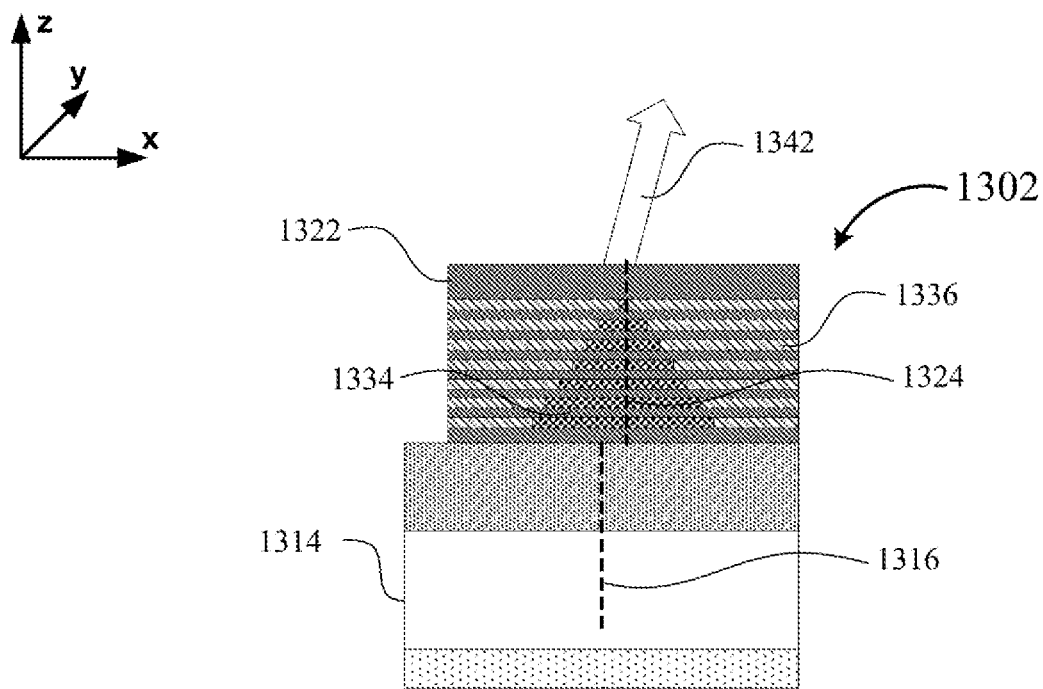
FIG. 13B illustrates an example of a light source including a surface-emitting light emitting device and a laterally offset planar optical component according to certain embodiments.

FIG. 13B illustrates an example of a light source 1302 including a surface-emitting light emitting device 1314 and a laterally offset planar optical component 1322 according to certain embodiments. Planar optical component 1322 may be formed in one or more semiconductor layers 1334 having different lateral oxide regions 1336 after an oxidation treatment, as discussed in reference to FIGS. 11A-12. In the example shown in FIG. 13B, the lateral oxidation may occur in both directions from the two sidewalls to form oxide regions 1336. The formation of oxide regions 1336 may result in a non-uniform effective optical thickness profile in the lateral direction of planar optical component 1322, such as the optical thickness profile of a lens with a desired focal length. However, the two sidewalls of planar optical component 1322 may not be symmetrical with respect to a center line 1316 of surface-emitting light emitting device 1314. As such, oxide regions 1336 may not be symmetrical with respect to center line 1316 of surface-emitting light emitting device 1314 either. Thus, a center line 1324 of planar optical component 1322 may not be aligned with center line 1316 of surface-emitting light emitting device 1314. In other words, planar optical component 1322 may be laterally displaced from surface-emitting light emitting device 1314. As such, in addition to collimating, converging, or diverging light beam 1342 emitted by surface-emitting light emitting device 1314, planar optical component 1322 may also change the direction of the chief ray of light beam 1342 as shown in FIG. 13B.

Figure 14A:
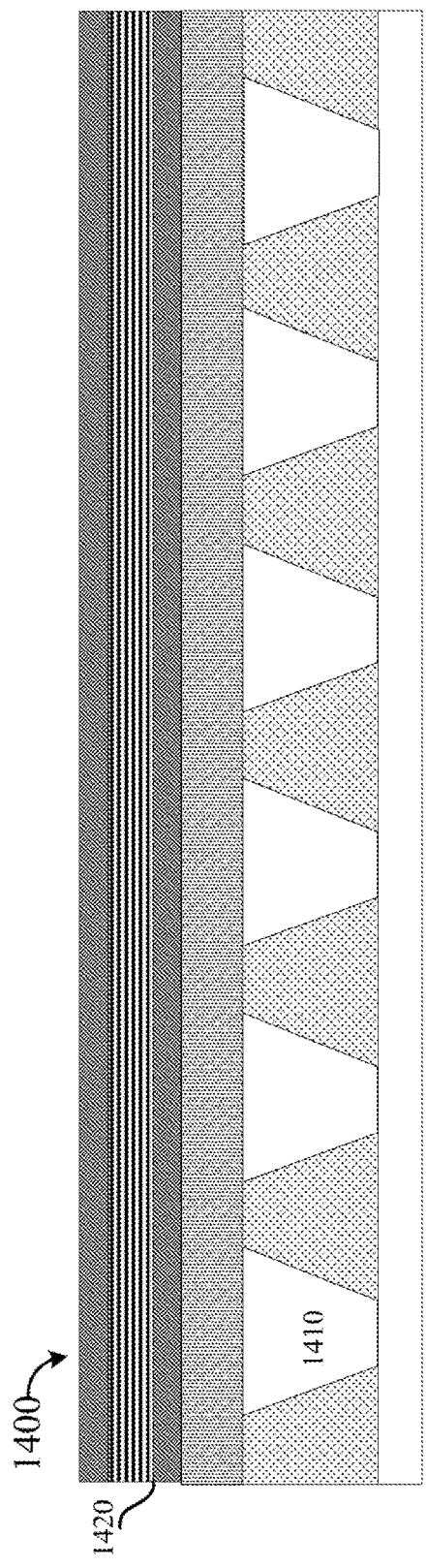
FIG. 14A illustrates an example of a wafer including an array of surface-emitting light emitting devices and a plurality of epitaxial layers with different compositions according to certain embodiments.

FIG. 14A illustrates an example of a wafer 1400 including an array of surface-emitting light emitting devices (e.g., micro-LEDs 1410 or VCSELs) and a plurality of epitaxial layers 1420 with different compositions according to certain embodiments. The array of micro-LEDs 1410 may include a one-dimensional or two dimensional array of micro-LEDs 1410. Micro-LEDs 1410 may be similar to the micro-LEDs described above. The plurality of epitaxial layers 1420 may be epitaxially grown on top of the array of micro-LEDs 1410 using, for example, MBE, LPE, CVD, or the like. The plurality of epitaxial layers 1420 may have with different compositions, such as $Al_xGa_{1-x}As$ with different aluminum concentrations, and thus may have different lateral oxidation rates. The plurality of epitaxial layers 1420 may be in adjacent epitaxial layers or may be interleaved with other semiconductor layers that may have much lower lateral oxidation rates. In some embodiments, the other semiconductor layers may have certain thicknesses and refractive indices to form an antireflection structure with epitaxial layers 1420. The x values for the plurality of epitaxial layers 1420 may change in the z direction, such as gradually increasing, gradually decreasing, decreasing and then increasing, or increasing and then decreasing.

Figure 14B:
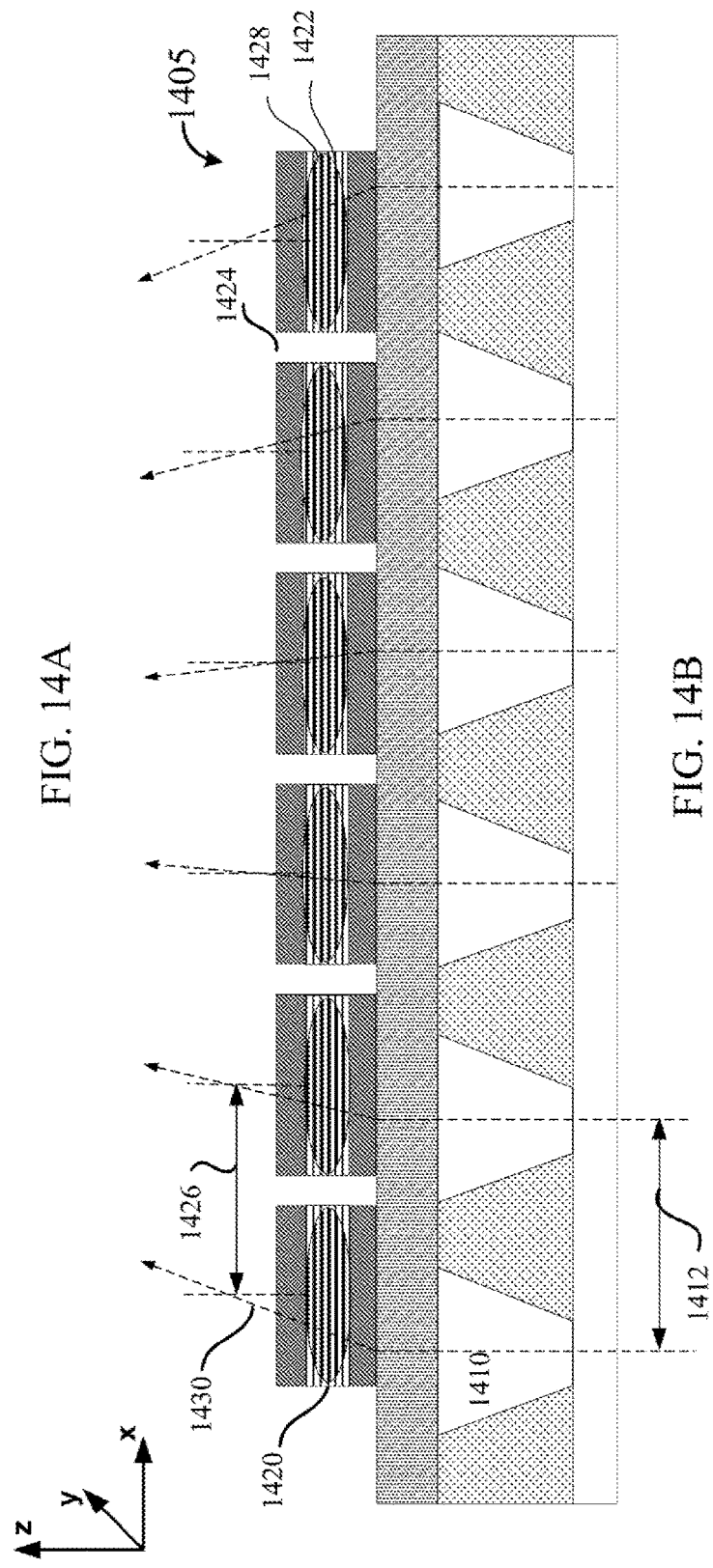
FIG. 14B illustrates an example of a wafer including an array of surface-emitting light emitting devices and a planar optical component array formed in the plurality of epitaxial layers according to certain embodiments.

FIG. 14B illustrates an example of a processed wafer 1405 including the array of surface-emitting light emitting devices (e.g., micro-LEDs 1410 or VCSELs) and an array of planar optical components 1422 formed in the plurality of epitaxial layers 1420 according to certain embodiments. Planar optical components 1422 may be used to extract, collimate, converge, diverge, and/or deflect light beams emitted from micro-LEDs 1410. As described in reference to FIG. 10, the array of micro-LEDs 1410 may include a one-dimensional or two-dimensional array of micro-LEDs 1410, where micro-LEDs 1410 may be uniformly distributed (with a pitch 1412) and may be separated by insulators (e.g., insulator 1030 of FIG. 10).

Planar optical components 1422 may be formed in the plurality of epitaxial layers 1420 by vertically etching trenches 1424 in epitaxial layers 1420 and laterally oxidizing epitaxial layers 1420 to form oxide regions 1428. In the example shown in FIG. 14B, The x values for the plurality of epitaxial layers 1420 may gradually decrease and then increase in the z direction. As such, the top and bottom layers of epitaxial layers 1420 may include larger oxide regions that have a lower refractive index than unoxidized regions of epitaxial layers 1420. Thus, an array of bi-convex lenses may be formed in the plurality of epitaxial layers 1420. The focal length and the vertical distance of the planar optical components 1422 from the corresponding micro-LEDs 1410 may be configured such that the light beam passing through each planar optical component may be a collimated beam, a converging beam, or a diverging beam.

In some embodiments, trenches 1424 may be etched or drilled in epitaxial layers 1420 at lateral positions according to a certain pattern to form desired planar optical components 1422 after selective oxidation treatment, as described above with respect to, for example, FIG. 12-13B. In the example shown in FIG. 14B, trenches 1424 may be etched according to a pattern such that a pitch 1426 of the array of planar optical components 1422 may be different (e.g., less than or greater than) from pitch 1412 of the array of micro-LED array 14210, and thus the optical axis of each planar optical component 1422 may be offset from the center of a respective micro-LED 1410 by a respective distance equal to or greater than zero. As such, the direction of a chief ray 1430 of the light beam from each micro-LED 1410 after passing through the corresponding planar optical component 1422 may be different.

The planar optical components described above may be manufactured on other semiconductor light sources made with various materials using techniques disclosed herein. The semiconductor light sources may include VCSELs that may each include an optically active region (e.g., quantum wells or quantum dots) disposed between two multilayer distributed Bragg reflecting (DBR) mirrors that form an optical cavity. Other types of wafer-level processed light sources may include, for example, LEDs, and RCLEDs with small lateral dimensions, such as less than a micron, a few microns, or a few tens of microns.

FIG. 15 illustrates an example of a light source 1500 including a VCSEL 1505 and a planar optical component 1550 according to certain embodiments. VCSEL 1505 may include an n-doped bottom layer 1510, a p-doped top layer 1530, an active region 1520, a bottom DBR mirror 1540, and a top DBR mirror 1542. Planar optical component 1550 may be formed on VCSEL 1505 by epitaxial growth. In some embodiments, planar optical component 1550 may include one or more semiconductor layers 1560 as described above in reference to FIGS. 11A-14B, and may be selectively oxidized to form different planar oxide regions 1562 in different semiconductor layers 1560 and thus an optical component with a certain OPL profile for modifying a light beam 1570 emitted by VCSEL 1505. As described in reference to FIGS. 11A-14B, planar optical component 1550 may modify the divergence, direction, or both, of light beam 1570 emitted by VCSEL 1505.

Planar optical component 1550 may be formed outside or within the optical cavity formed by top DBR mirror 1542 and bottom DBR mirror 1540. For example, planar optical component 1550 may be formed on top DBR mirror 1542 in a top-emitting VCSEL or on bottom DBR mirror 1540 in a bottom-emitting VCSEL. Alternatively, planar optical component 1550 may be formed within the optical cavity but outside of the carrier conducting regions, such as between top DBR mirror 1542 and p-doped top layer 1530, or between bottom DBR mirror 1540 and n-doped bottom layer 1510.

Figures 16A, 16B:
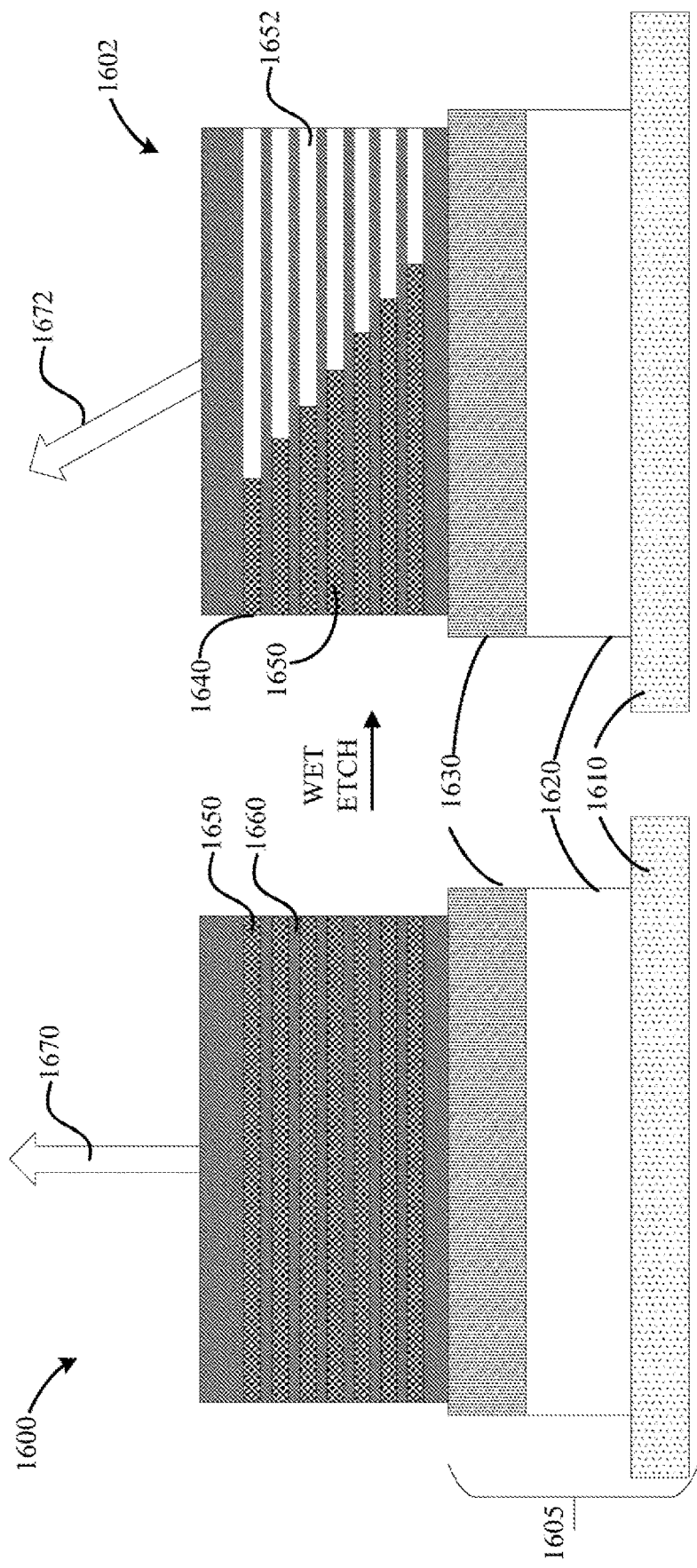
FIG. 16A illustrates an example of a device including a surface-emitting light emitting device and a plurality of epitaxial layers with different compositions according to certain embodiments.
FIG. 16B illustrates an example of a device including a surface-emitting light emitting device and an optical component etched in the plurality of epitaxial layers according to certain embodiments.

FIG. 16A illustrates an example of a device 1600 including a surface-emitting light emitting device 1605 and a plurality of epitaxial layers 1650 with different compositions according to certain embodiments. As described above, surface-emitting light emitting device 1605 may include a first carrier injection layer 1610 (e.g., an n-doped layer), an active region 1620 where electron-hole pairs may combine to emit photons, and a second carrier injection layer 1630 (e.g., a p-doped layer). Epitaxial layers 1650 may include, for example, $(Al_xGa_{1-x})_{0.5}In_{0.5}P$ alloy, where the x value or doping level in each layer may vary across the plurality of epitaxial layers 1650. Epitaxial layers 1650 may be grown in adjacent layers or may be grown alternately with a plurality of interlayers 1660. Surface-emitting light emitting device 1605 and the plurality of epitaxial layers 1650 may be etched to form individually addressable light sources with certain mesa structures, such as micro-LEDs or VCSELs. Light beam 1670 emitted by surface-emitting light emitting device 1605 may be coupled out of device 1600 in a surface-normal direction. To change the direction of the chief ray of light beam 1670, the plurality of epitaxial layers 1650 may be laterally etched from the sidewalls of the mesa structures using liquid etchants, such as, for example, sulfuric and hydrochloric acids, in a wet etching process.

FIG. 16B illustrates an example of a device 1602 including surface-emitting light emitting device 1605 and an optical component 1640 etched in the plurality of epitaxial layers 1650 according to certain embodiments. The plurality of epitaxial layers 1650, due to their different compositions or doping levels, may be laterally etched in different rates in liquid solution including etchants such as hydrochloric acid and/or sulfuric acid. As such, after a certain etching duration, different lateral regions of the plurality of epitaxial layers 1650 may be remove, forming voids 1652 in the plurality of epitaxial layers 1650. Thus, the plurality of epitaxial layers 1650 may function as an optical component 1640, such as a micro-lens or a prism, which may collimate, converge, diverge, or deflect light beam 1672 emitted by surface-emitting light emitting device 1605.

FIG. 17 is a flowchart illustrating an example of a process 1700 for fabricating a planar optical component on a light emitting device according to certain embodiments. While the operations are illustrated in a particular order in FIG. 17, it should be understood that no particular order may be required and that certain operations can be omitted. While the operations are described for a single light emitting device, it should be understood that the process may be performed on a wafer level to fabricate an array of planar optical components for an array of light emitting devices.

Process 1700 may begin with operation 1702 to deposit a plurality of semiconductor layers characterized by different lateral oxidation rates or lateral etch rates on a semiconductor light emitting device, such as an LED, micro-LED, VCSEL, VECSEL, RCLED, or the like. Operation 1702 may be performed at a wafer level to fabricate an engineered wafer including the plurality of semiconductor layers. The plurality of semiconductor layers may have different compositions or different doping levels to cause the different etch rates. For example, as described above, the composition of each semiconductor layer may have a respective aluminum to gallium ratio in aluminum gallium arsenide ($Al_xGa_{1-x}As$). The composition of each semiconductor layer may be controlled by, for example, the amount of each reactant used in the epitaxial growth or the doping level of a dopant. The light emitting device may include a plurality of layers grown on a wafer, which may include a substrate compatible with materials and operation of the light emitting device.

Optionally, in operation 1704, mesa structures for the light emitting device may be formed. The mesa structure may be used for current injection and light confinement, as described in reference to FIGS. 7A and 7B. For instance, the light emitting device may include a VCSEL including an active region, an n-doped layer, a p-doped layer, and DBR layers that may be included in a vertical mesa structure, or may include a micro-LEDs with a mesa structure, such as a vertical, conical, or parabolic mesa structure that includes a first carrier injection layer (e.g., an n-doped layer), an active region where electron-hole pairs may combine to emit photons, and a second carrier injection layer (e.g., a p-doped layer).

Operation 1706 may include forming trenches in the plurality of semiconductor layers. The trenches may be etched or drilled according to a pattern to form a mesa structure in the plurality of semiconductor layers deposited in operation 1702. As described in reference to FIGS. 13A, 13B, and 14B, the mesa structure in the plurality of semiconductor layers may be laterally aligned with mesa structure of the light emitting device, or it may be laterally displaced relative to the mesa structure of the light emitting device.

Operation 1708 may include lateral oxidation or wet-etching of the semiconductor layers grown by operation 1702, as described above in reference to FIGS. 11A-16. Due to the different compositions or doping levels of the semiconductor layers, the lateral oxidation rate or the lateral etch rate may vary in the semiconductor layers to form different lateral oxide regions in the semiconductor layers, which may result in spatially variant effective optical thickness in the semiconductor layers. As described in reference to FIG. 16B, operation 1708 may alternatively include wet-chemical etching using etchants such as acid, where voids or air gaps may be formed in the resultant planar optical component.

FIG. 18A illustrates an example of a method of die-to-wafer bonding for arrays of LEDs according to certain embodiments. In the example shown in FIG. 18A, an LED array 1801 may include a plurality of LEDs 1807 on a carrier substrate 1805. Carrier substrate 1805 may include various materials, such as GaAs, InP, GaN, AlN, sapphire, SiC, Si, or the like. LEDs 1807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 1803 may include a base layer 1809 having passive or active integrated circuits (e.g., driver circuits 1811) fabricated thereon. Base layer 1809 may include, for example, a silicon wafer. Driver circuits 1811 may be used to control the operations of LEDs 1807. For example, the driver circuit for each LED 1807 may include a 2T1C pixel structure that has two transistors and one capacitor. Wafer 1803 may also include a bonding layer 1813. Bonding layer 1813 may include various materials, such as a metal, an oxide, a dielectric, CuSn, AuTi, and the like. In some embodiments, a patterned layer 1815 may be formed on a surface of bonding layer 1813, where patterned layer 1815 may include a metallic grid made of a conductive material, such as Cu, Ag, Au, Al, or the like.

LED array 1801 may be bonded to wafer 1803 via bonding layer 1813 or patterned layer 1815. For example, patterned layer 1815 may include metal pads or bumps made of various materials, such as CuSn, AuSn, or nanoporous Au, that may be used to align LEDs 1807 of LED array 1801 with corresponding driver circuits 1811 on wafer 1803. In one example, LED array 1801 may be brought toward wafer 1803 until LEDs 1807 come into contact with respective metal pads or bumps corresponding to driver circuits 1811. Some or all of LEDs 1807 may be aligned with driver circuits 1811, and may then be bonded to wafer 1803 via patterned layer 1815 by various bonding techniques, such as metal-to-metal bonding. After LEDs 1807 have been bonded to wafer 1803, carrier substrate 1805 may be removed from LEDs 1807.

FIG. 18B illustrates an example of a method of wafer-to-wafer bonding for arrays of LEDs according to certain embodiments. As shown in FIG. 18B, a first wafer 1802 may include a substrate 1804, a first semiconductor layer 1806, active layers 1808, and a second semiconductor layer 1810. Substrate 1804 may include various materials, such as GaAs, InP, GaN, AlN, sapphire, SiC, Si, or the like. First semiconductor layer 1806, active layers 1808, and second semiconductor layer 1810 may include various semiconductor materials, such as GaN, InGaN, (AlGaIn)P, (AlGaIn)AsP, (AlGaIn)AsN, (AlGaIn)Pas, (Eu:InGa)N, (AlGaIn)N, or the like. In some embodiments, first semiconductor layer 1806 may be an n-type layer, and second semiconductor layer 1810 may be a p-type layer. For example, first semiconductor layer 1806 may be an n-doped GaN layer (e.g., doped with Si or Ge), and second semiconductor layer 1810 may be a p-doped GaN layer (e.g., doped with Mg, Ca, Zn, or Be). Active layers 1808 may include, for example, one or more GaN layers, one or more InGaN layers, one or more AlInGaP layers, and the like, which may form one or more heterostructures, such as one or more quantum wells or MQWs.

In some embodiments, first wafer 1802 may also include a bonding layer. Bonding layer 1812 may include various materials, such as a metal, an oxide, a dielectric, CuSn, AuTi, or the like. In one example, bonding layer 1812 may include p-contacts and/or n-contacts (not shown). In some embodiments, other layers may also be included on first wafer 1802, such as a buffer layer between substrate 1804 and first semiconductor layer 1806. The buffer layer may include various materials, such as polycrystalline GaN or AlN. In some embodiments, a contact layer may be between second semiconductor layer 1810 and bonding layer 1812. The contact layer may include any suitable material for providing an electrical contact to second semiconductor layer 1810 and/or first semiconductor layer 1806.

First wafer 1802 may be bonded to wafer 1803 that includes driver circuits 1811 and bonding layer 1813 as described above, via bonding layer 1813 and/or bonding layer 1812. Bonding layer 1812 and bonding layer 1813 may be made of the same material or different materials. Bonding layer 1813 and bonding layer 1812 may be substantially flat. First wafer 1802 may be bonded to wafer 1803 by various methods, such as metal-to-metal bonding, eutectic bonding, metal oxide bonding, anodic bonding, thermo-compression bonding, ultraviolet (UV) bonding, and/or fusion bonding.

As shown in FIG. 18B, first wafer 1802 may be bonded to wafer 1803 with the p-side (e.g., second semiconductor layer 1810) of first wafer 1802 facing down (i.e., toward wafer 1803). After bonding, substrate 1804 may be removed from first wafer 1802, and first wafer 1802 may then be processed from the n-side. The processing may include, for example, the formation of certain mesa shapes for individual LEDs, as well as the formation of optical components corresponding to the individual LEDs.

Figure 19A:
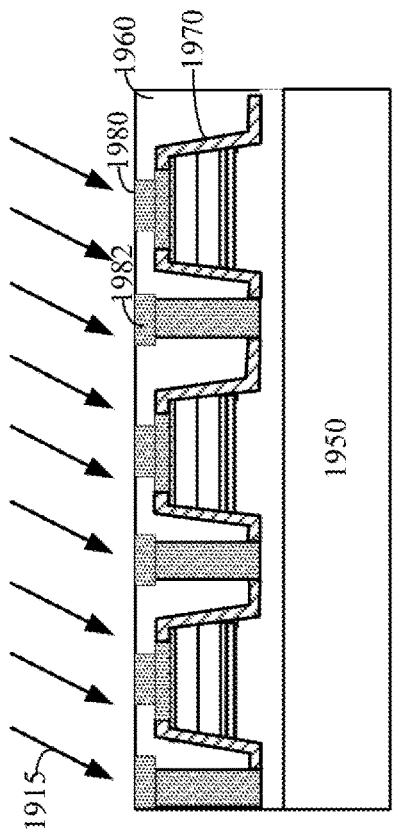
FIGS. 19A-19D illustrates an example of a method of hybrid bonding for arrays of LEDs according to certain embodiments.

FIGS. 19A-9D illustrate an example of a method of hybrid bonding for arrays of LEDs according to certain embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 19A shows a substrate 1910 with passive or active circuits 1920 manufactured thereon. As described above with respect to FIGS. 18A-18B, substrate 1910 may include, for example, a silicon wafer. Circuits 1920 may include driver circuits for the arrays of LEDs. A bonding layer may include dielectric regions 1940 and contact pads 1930 connected to circuits 1920 through electrical interconnects 1922. Contact pads 1930 may include, for example, Cu, Ag, Au, Al, W, Mo, Ni, Ti, Pt, Pd, or the like. Dielectric materials in dielectric regions 1940 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or fast atom (e.g., Ar) beam 1905. The activated surface may be atomically clean and may be reactive for formation of direct bonds between wafers when they are brought into contact, for example, at room temperature.

Figure 19B:
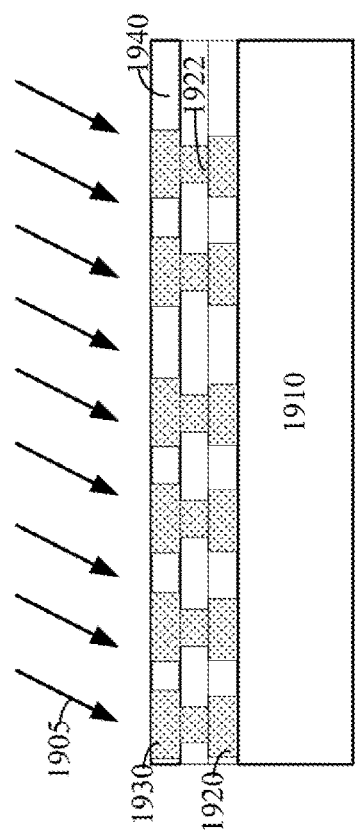

FIG. 19B illustrates a wafer 1950 including an array of micro-LEDs 1970 fabricated thereon as described above with respect to, for example, FIGS. 7A-7B and 18A-18B. Wafer 1950 may be a carrier wafer and may include, for example, GaAs, InP, GaN, AlN, sapphire, SiC, Si, or the like. Micro-LEDs 1970 may include an n-type layer, an active region, and a p-type layer epitaxially grown on wafer 1950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 1980 and n-contacts 1982 may be formed in a dielectric material layer 1960 deposited on the mesa structures and may make electrical contacts with the p-type layer and the n-type layers, respectively. Dielectric materials in dielectric material layer 1960 may include, for example, SiCN, $SiO_2$, SiN, $Al_2O_3$, $HfO_2$, $ZrO_2$, $Ta_2O_5$, or the like. P-contacts 1980 and n-contacts 1982 may include, for example, Cu, Ag, Au, Al, W, Mo, Ni, Ti, Pt, Pd, or the like. The top surfaces of p-contacts 1980, n-contacts 1982, and dielectric material layer 1960 may form a bonding layer. The bonding layer may be planarized and polished using, for example, chemical mechanical polishing, where the polishing may cause dishing in p-contacts 1980 and n-contacts 1982. The bonding layer may then be cleaned and activated by, for example, an ion (e.g., plasma) or fast atom (e.g., Ar) beam 1915. The activated surface may be atomically clean and reactive for formation of direct bonds between wafers when they are brought into contact, for example, at room temperature.

Figure 19D:
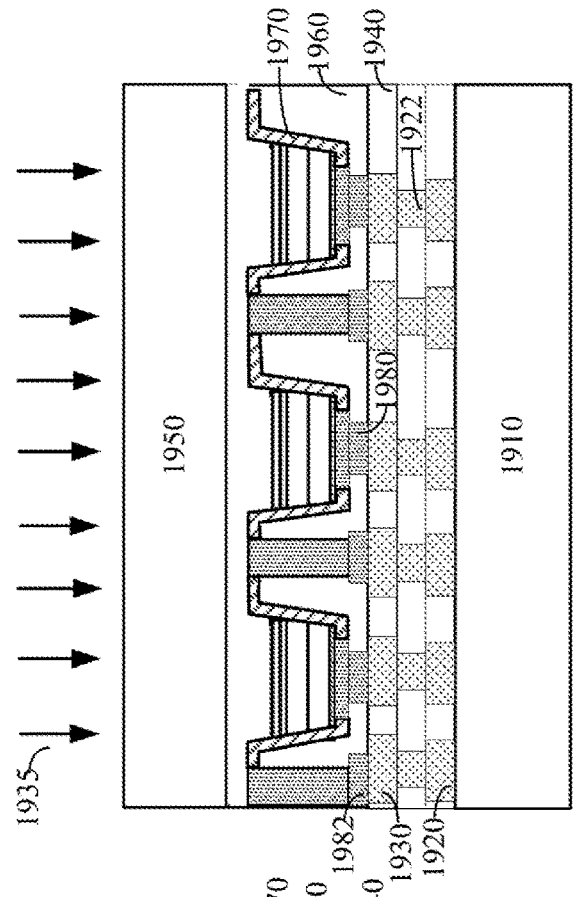
Figure 19C:
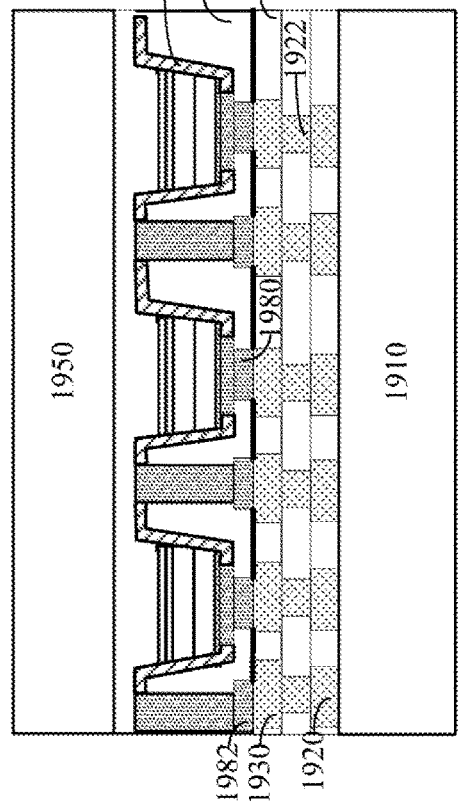

FIG. 19C illustrates a room temperature bonding process for bonding the dielectric materials in the bonding layers. For example, after the bonding layer that includes dielectric regions 1940 and contact pads 1930 and the bonding layer that includes p-contacts 1980, n-contacts 1982, and dielectric material layer 1960 are surface activated, wafer 1950 and micro-LEDs 1970 may be turned upside down and brought into contact with substrate 1910 and the circuits formed thereon. In some embodiments, compression pressure 1925 may be applied to substrate 1910 and wafer 1950 such that the bonding layers are pressed against each other. Due to the surface activation and the dishing in the contacts, dielectric regions 1940 and dielectric material layer 1960 may be in direct contact because of the surface attractive force, and may react and form chemical bonds between them because the surface atoms may have dangling bonds and may be in unstable energy states after the activation. Thus, the dielectric materials in dielectric regions 1940 and dielectric material layer 1960 may be bonded together with or without heat treatment or pressure.

FIG. 19D illustrates an annealing process for bonding the contacts in the bonding layers after bonding the dielectric materials in the bonding layers. For example, contact pads 1930 and p-contacts 1980 or n-contacts 1982 may be bonded together by annealing at, for example, about 200-400° C. or higher. During the annealing process, heat 1935 may cause the contacts to expand more than the dielectric materials (due to different coefficients of thermal expansion), and thus may close the dishing gaps between the contacts such that contact pads 1930 and p-contacts 1980 or n-contacts 1982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 20:
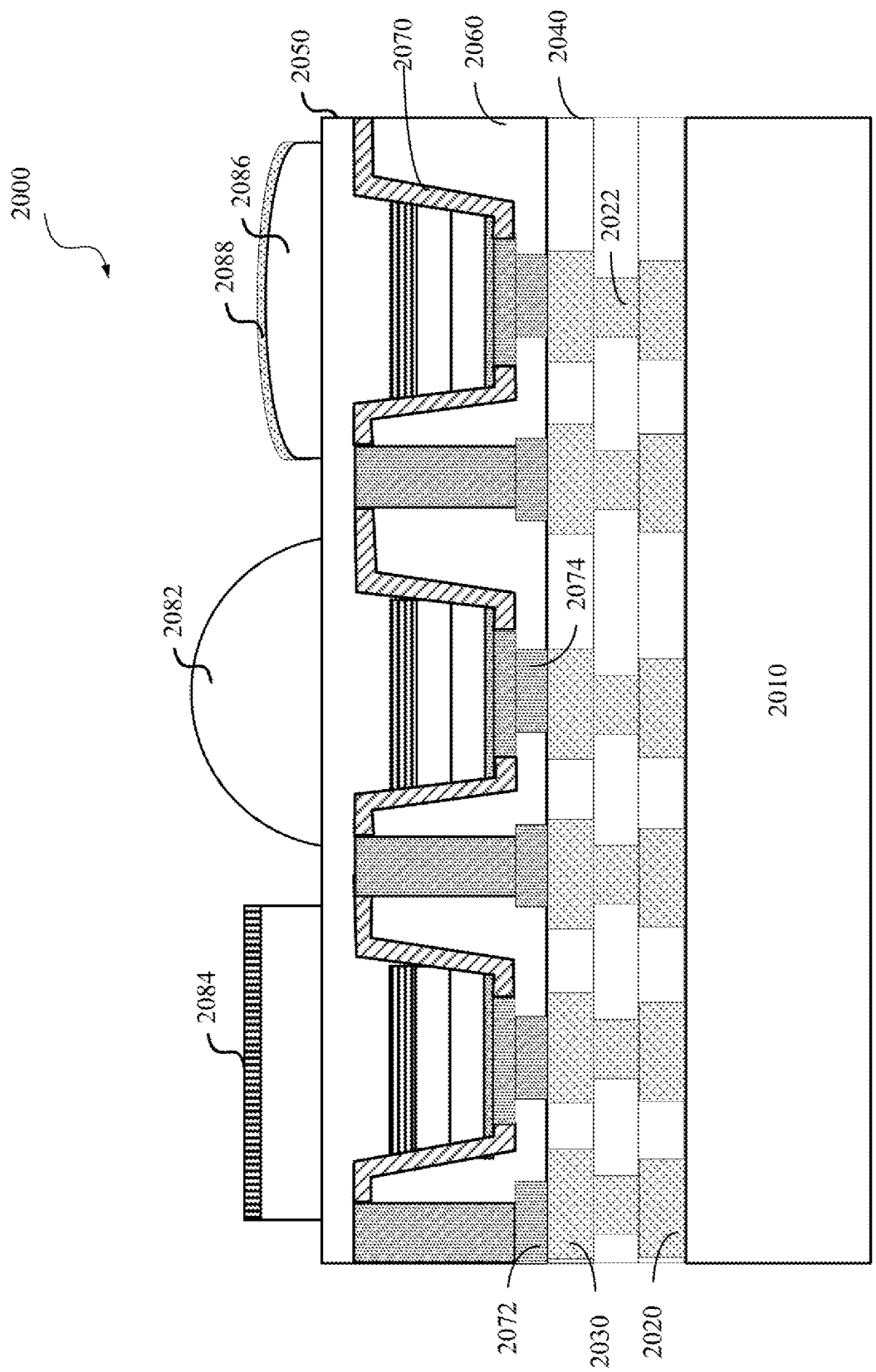
FIG. 20 illustrates an example of an LED array with secondary optical components fabricated thereon according to certain embodiments.

FIG. 20 illustrates an example of an LED array 2000 with secondary optical components fabricated thereon according to certain embodiments. LED array 2000 may be made by bonding an LED chip or wafer with a silicon wafer including electrical circuits fabricated thereon, using any suitable bonding techniques described above with respect to, for example, FIGS. 18A-19D. In the example shown in FIG. 20, LED array 2000 may be bonded using a wafer-to-wafer hybrid bonding technique as described above with respect to FIG. 19A-19D. LED array 2000 may include a substrate 2010, which may be, for example, a silicon wafer. Integrated circuits 2020, such as LED driver circuits, may be fabricated on substrate 2010. Integrated circuits 2020 may be connected to p-contacts 2074 and n-contacts 2072 of micro-LEDs 2070 through interconnects 2022 and contact pads 2030, where contact pads 2030 may form metallic bonds with p-contacts 2074 and n-contacts 2072. Dielectric layer 2040 on substrate 2010 may be bonded to dielectric layer 2060 through fusion bonding.

The substrate (not shown) of the LED chip or wafer may be thinned or may be removed to expose the n-type layer 2050 of micro-LEDs 2070. Various secondary optical components, such as a spherical micro-lens 2082, a grating 2084, a micro-lens 2086, an antireflection layer 2088, and the like, may be formed in or on top of n-type layer 2050. For example, spherical micro-lens arrays may be etched in the semiconductor materials of micro-LEDs 2070 using a grayscale mask and a photoresist with a linear response to exposure light, or using an etch mask formed by thermal reflowing of a patterned photoresist layer. The secondary optical components may also be etched in a dielectric layer deposited on n-type layer 2050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, a micro-LED 2070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 20 to show some examples of secondary optical components that can be formed on micro-LEDs 2070, which does not necessary imply that different secondary optical components are used simultaneously for every LED array.

Figure 21:
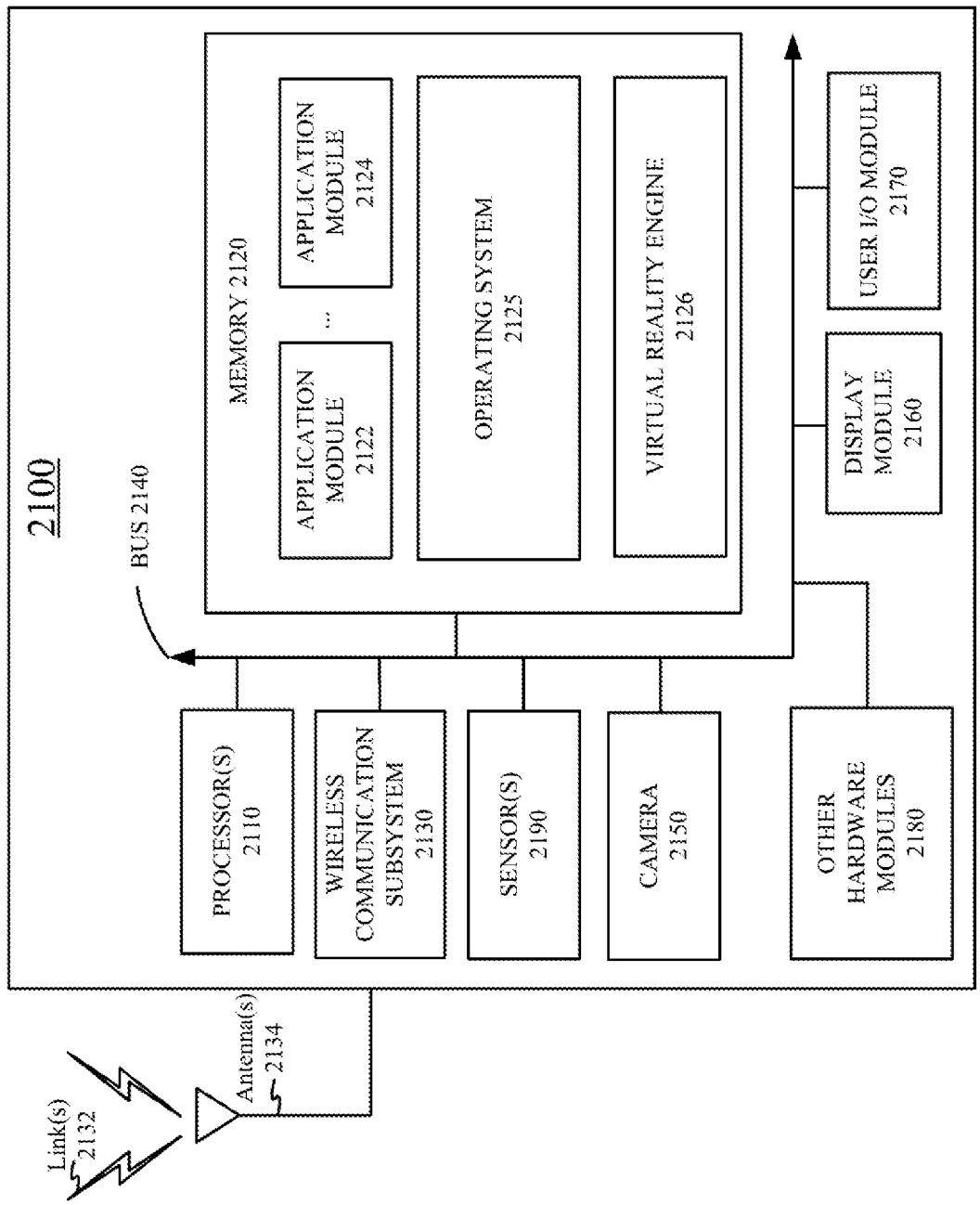
FIG. 21 is a simplified block diagram of an electronic system of an example of a near-eye display according to certain embodiments.

FIG. 21 is a simplified block diagram of an example electronic system 2100 of an example near-eye display (e.g., HMD device) for implementing some of the examples disclosed herein. Electronic system 2100 may be used as the electronic system of an HMD device or other near-eye displays described above. In this example, electronic system 2100 may include one or more processor(s) 2110 and a memory 2120. Processor(s) 2110 may be configured to execute instructions for performing operations at a number of components, and can be, for example, a general-purpose processor or microprocessor suitable for implementation within a portable electronic device. Processor(s) 2110 may be communicatively coupled with a plurality of components within electronic system 2100. To realize this communicative coupling, processor(s) 2110 may communicate with the other illustrated components across a bus 2140. Bus 2140 may be any subsystem adapted to transfer data within electronic system 2100. Bus 2140 may include a plurality of computer buses and additional circuitry to transfer data.

Memory 2120 may be coupled to processor(s) 2110. In some embodiments, memory 2120 may offer both short-term and long-term storage and may be divided into several units. Memory 2120 may be volatile, such as static random access memory (SRAM) and/or dynamic random access memory (DRAM) and/or non-volatile, such as read-only memory (ROM), flash memory, and the like. Furthermore, memory 2120 may include removable storage devices, such as secure digital (SD) cards. Memory 2120 may provide storage of computer-readable instructions, data structures, program modules, and other data for electronic system 2100. In some embodiments, memory 2120 may be distributed into different hardware modules. A set of instructions and/or code might be stored on memory 2120. The instructions might take the form of executable code that may be executable by electronic system 2100, and/or might take the form of source and/or installable code, which, upon compilation and/or installation on electronic system 2100 (e.g., using any of a variety of generally available compilers, installation programs, compression/decompression utilities, etc.), may take the form of executable code.

In some embodiments, memory 2120 may store a plurality of application modules 2122 through 2124, which may include any number of applications. Examples of applications may include gaming applications, conferencing applications, video playback applications, or other suitable applications. The applications may include a depth sensing function or eye tracking function. Application modules 2122-2124 may include particular instructions to be executed by processor(s) 2110. In some embodiments, certain applications or parts of application modules 2122-2124 may be executable by other hardware modules 2180. In certain embodiments, memory 2120 may additionally include secure memory, which may include additional security controls to prevent copying or other unauthorized access to secure information.

In some embodiments, memory 2120 may include an operating system 2125 loaded therein. Operating system 2125 may be operable to initiate the execution of the instructions provided by application modules 2122-2124 and/or manage other hardware modules 2180 as well as interfaces with a wireless communication subsystem 2130 which may include one or more wireless transceivers. Operating system 2125 may be adapted to perform other operations across the components of electronic system 2100 including threading, resource management, data storage control and other similar functionality.

Wireless communication subsystem 2130 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 2100 may include one or more antennas 2134 for wireless communication as part of wireless communication subsystem 2130 or as a separate component coupled to any portion of the system. Depending on desired functionality, wireless communication subsystem 2130 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 2130 may permit data to be exchanged with a network, other computer systems, and/or any other devices described herein. Wireless communication subsystem 2130 may include a means for transmitting or receiving data, such as identifiers of HMD devices, position data, a geographic map, a heat map, photos, or videos, using antenna(s) 2134 and wireless link(s) 2132. Wireless communication subsystem 2130, processor(s) 2110, and memory 2120 may together comprise at least a part of one or more of a means for performing some functions disclosed herein.

Embodiments of electronic system 2100 may also include one or more sensors 2190. Sensor(s) 2190 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 2190 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or any combination thereof. The position sensors may be located external to the IMU, internal to the IMU, or any combination thereof. At least some sensors may use a structured light pattern for sensing.

Electronic system 2100 may include a display module 2160. Display module 2160 may be a near-eye display, and may graphically present information, such as images, videos, and various instructions, from electronic system 2100 to a user. Such information may be derived from one or more application modules 2122-2124, virtual reality engine 2126, one or more other hardware modules 2180, a combination thereof, or any other suitable means for resolving graphical content for the user (e.g., by operating system 2125). Display module 2160 may use LCD technology, LED technology (including, for example, OLED, ILED, µ-LED, AMOLED, TOLED, etc.), light emitting polymer display (LPD) technology, or some other display technology.

Electronic system 2100 may include a user input/output module 2170. User input/output module 2170 may allow a user to send action requests to electronic system 2100. An action request may be a request to perform a particular action. For example, an action request may be to start or end an application or to perform a particular action within the application. User input/output module 2170 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 2100. In some embodiments, user input/output module 2170 may provide haptic feedback to the user in accordance with instructions received from electronic system 2100. For example, the haptic feedback may be provided when an action request is received or has been performed.

Electronic system 2100 may include a camera 2150 that may be used to take photos or videos of a user, for example, for tracking the user's eye position. Camera 2150 may also be used to take photos or videos of the environment, for example, for VR, AR, or MR applications. Camera 2150 may include, for example, a complementary metal-oxide-semiconductor (CMOS) image sensor with a few millions or tens of millions of pixels. In some implementations, camera 2150 may include two or more cameras that may be used to capture 3-D images.

In some embodiments, electronic system 2100 may include a plurality of other hardware modules 2180. Each of other hardware modules 2180 may be a physical module within electronic system 2100. While each of other hardware modules 2180 may be permanently configured as a structure, some of other hardware modules 2180 may be temporarily configured to perform specific functions or temporarily activated. Examples of other hardware modules 2180 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 2180 may be implemented in software.

In some embodiments, memory 2120 of electronic system 2100 may also store a virtual reality engine 2126. Virtual reality engine 2126 may execute applications within electronic system 2100 and receive position information, acceleration information, velocity information, predicted future positions, or any combination thereof of the HMD device from the various sensors. In some embodiments, the information received by virtual reality engine 2126 may be used for producing a signal (e.g., display instructions) to display module 2160. For example, if the received information indicates that the user has looked to the left, virtual reality engine 2126 may generate content for the HMD device that mirrors the user's movement in a virtual environment. Additionally, virtual reality engine 2126 may perform an action within an application in response to an action request received from user input/output module 2170 and provide feedback to the user. The provided feedback may be visual, audible, or haptic feedback. In some implementations, processor(s) 2110 may include one or more GPUs that may execute virtual reality engine 2126.

In various implementations, the above-described hardware and modules may be implemented on a single device or on multiple devices that can communicate with one another using wired or wireless connections. For example, in some implementations, some components or modules, such as GPUs, virtual reality engine 2126, and applications (e.g., tracking application), may be implemented on a console separate from the head-mounted display device. In some implementations, one console may be connected to or support more than one HMD.

In alternative configurations, different and/or additional components may be included in electronic system 2100. Similarly, functionality of one or more of the components can be distributed among the components in a manner different from the manner described above. For example, in some embodiments, electronic system 2100 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A semiconductor light source comprising:
 a light emitting device configured to emit a light beam surface-normally; and
 a plurality of semiconductor layers epitaxially grown on the light emitting device and forming a planar optical component that is configured to refract and modify a wavefront of the light beam emitted by the light emitting device,
 wherein each semiconductor layer of the plurality of semiconductor layers includes a first lateral region and a second lateral region, the first lateral region and the second lateral region characterized by different respective refractive indices; and wherein the first lateral regions of different semiconductor layers of the plurality of semiconductor layers are in two or more different lateral areas of the semiconductor light source such that an optical path length (OPL) profile of the plurality of semiconductor layers is characterized by an OPL profile of at least one of a lens laterally aligned with the light emitting device, a lens laterally offset from the light emitting device, or a prism.

2. The semiconductor light source of claim 1, wherein the second lateral region in each semiconductor layer of the plurality of semiconductor layers includes a semiconductor material with a different respective composition.

3. The semiconductor light source of claim 2, wherein the semiconductor material in the second lateral region in each semiconductor layer of the plurality of semiconductor layers is characterized by a different respective lateral oxidation or etch rate.

4. The semiconductor light source of claim 2, wherein the second lateral region in each semiconductor layer of the plurality of semiconductor layers includes $Al_xGa_{1-x}As$ and is characterized by a different respective x value that is greater than 0.7.

5. The semiconductor light source of claim 2, wherein the second lateral region in each semiconductor layer of the plurality of semiconductor layers includes $(Al_xGa_{1-x})_{0.5}In_{0.5}P$ and is characterized by a different respective x value.

6. The semiconductor light source of claim 1, wherein:
the first lateral region includes an oxide region; and
the second lateral region includes an unoxidized semiconductor region.

7. The semiconductor light source of claim 1, wherein each semiconductor layer of the plurality of semiconductor layers includes a planar layer.

8. The semiconductor light source of claim 1, wherein the plurality of semiconductor layers are in adjacent epitaxial layers.

9. The semiconductor light source of claim 1, wherein the plurality of semiconductor layers are interleaved with a plurality of interlayers.

10. The semiconductor light source of claim 9, wherein the plurality of semiconductor layers and the plurality of interlayers are configured to form an antireflection structure for the light beam.

11. The semiconductor light source of claim 1, wherein sizes of the first lateral regions of the plurality of semiconductor layers vary layer-to-layer such that the plurality of semiconductor layers forms the planar optical component to collimate, converge, diverge, or deflect the light beam emitted by the light emitting device.

12. The semiconductor light source of claim 1, wherein:
the light emitting device comprises a current conduction region including:
an electron injection layer;
a hole injection layer; and
a light emission layer between the electron injection layer and the hole injection layer; and
the plurality of semiconductor layers are outside of the current conduction region.

13. The semiconductor light source of claim 1, wherein:
the first lateral region includes an air gap; and
the second lateral region includes a semiconductor material.

14. The semiconductor light source of claim 12, wherein the light emission layer includes a quantum dot structure, a quantum well structure, or a multiple-quantum-well (MQW) structure.

15. The semiconductor light source of claim 1, wherein:
the semiconductor light source comprises an optical cavity; and
the plurality of semiconductor layers are in the optical cavity.

16. The semiconductor light source of claim 1, wherein the light emitting device includes a light emitting diode (LED), a micro-LED, a resonant cavity LED (RCLED), a vertical cavity surface emitting laser (VCSEL), or a vertical external cavity surface emitting laser (VECSEL).

17. A display projector comprising an array of light sources, each light source in the array of light sources comprising:
a light emitting device configured to emit a light beam surface-normally; and
a planar optical component including a plurality of semiconductor layers epitaxially grown on the light emitting device, the planar optical component configured to transmit and modify a shape or a direction of a wavefront of the light beam emitted by the light emitting device, wherein:
each semiconductor layer of the plurality of semiconductor layers includes a first lateral region and a second lateral region, the first lateral region and the second lateral region characterized by different respective refractive indices; and
the first lateral regions of different semiconductor layers of the plurality of semiconductor layers are in two or more different lateral areas of the planar optical component such that an optical path length (OPL) profile of the plurality of semiconductor layers is characterized by an OPL profile of at least one of a lens laterally aligned with the light emitting device, a lens laterally offset from the light emitting device, or a prism.

18. The display projector of claim 17, wherein the second lateral region in each semiconductor layer of the plurality of semiconductor layers includes a semiconductor material characterized by a different respective composition.

19. The display projector of claim 17, wherein the planar optical component in each light source is configured to direct the light beam emitted by the light emitting device to a different respective direction.

20. The display projector of claim 17, wherein the planar optical component in each light source of the array of light sources includes a lens characterized by a different respective lateral displacement from the light emitting device in the light source.

21. The display projector of claim 17, wherein the array of light sources includes a two-dimensional array of light sources.

22. The display projector of claim 17, wherein each light source in the array of light sources further comprises a driver circuit bonded to the light emitting device.

23. A semiconductor wafer comprising:
an n-type semiconductor layer;
a p-type semiconductor layer;
a light emitting layer between the n-type semiconductor layer and the p-type semiconductor layer; and
a plurality of epitaxial layers grown on the n-type semiconductor layer or the p-type semiconductor layer, wherein:

each epitaxial layer of the plurality of epitaxial layers includes a different respective composition of a semiconductor material and is characterized by a different respective lateral oxidation or etch rate such that, upon trench formation and lateral oxidation or etching in the plurality of epitaxial layers, an optical path length (OPL) profile of the plurality of epitaxial layers is characterized by an OPL profile of a lens, a prism, or a combination thereof.

24. The semiconductor wafer of claim 23, wherein the plurality of epitaxial layers are in adjacent layers.

25. The semiconductor wafer of claim 23, wherein the plurality of epitaxial layers are interleaved with a plurality of interlayers that are characterized by a lower lateral oxidation or etch rate than the plurality of epitaxial layers.

26. The semiconductor wafer of claim 23, wherein each of the plurality of epitaxial layers includes $Al_xGa_{1-x}As$ or $(Al_xGa_{1-x})_{0.5}In_{0.5}P$ and is characterized by a different respective x value.

27. A display system comprising:
an array of light sources configured to generate display light for an image;
a waveguide display; and
an optical coupler configured to couple the display light into the waveguide display,
wherein each light source in the array of light sources comprises:
a light emitting device configured to emit a light beam surface-normally; and
a planar optical component configured to direct the light beam to a different respective direction, the planar optical component including a plurality of planar semiconductor layers epitaxially grown on the light emitting device, wherein an optical path length (OPL) profile of the plurality of planar semiconductor layers is characterized by an OPL profile of at least one of a lens laterally aligned with the light emitting device, a lens laterally offset from the light emitting device, or a prism.

28. The display system of claim 27, wherein:
each planar semiconductor layer of the plurality of planar semiconductor layers includes a first lateral region and a second lateral region, the first lateral region and the second lateral region characterized by different respective refractive indices; and
the first lateral regions of the plurality of planar semiconductor layers are in two or more different lateral areas of the planar optical component.

29. A method comprising:
depositing a plurality of semiconductor layers on a light emitting device, the plurality of semiconductor layers characterized by different compositions and different lateral oxidation rates or lateral etch rates, wherein a mole fraction of a chemical element in the plurality of semiconductor layers varies gradually from layer to layer;
forming trenches in the plurality of semiconductor layers; and
performing, through the trenches, lateral oxidation or lateral etching of the plurality of semiconductor layers to form a planar optical component that is configured to refract and modify a wavefront of a light beam emitted by the light emitting device, wherein an optical path length (OPL) profile of the plurality of semiconductor layers in the planar optical component is characterized by an OPL profile of at least one of a lens laterally aligned with the light emitting device, a lens laterally offset from the light emitting device, or a prism.

* * * * *